(12) United States Patent
Yeung et al.

(10) Patent No.: US 7,978,754 B2
(45) Date of Patent: Jul. 12, 2011

(54) COMMUNICATION CHANNEL CALIBRATION WITH NONVOLATILE PARAMETER STORE FOR RECOVERY

(75) Inventors: Philip Yeung, Mountain View, CA (US); Richard E Perego, San Jose, CA (US); Scott C Best, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 2065 days.

(21) Appl. No.: 10/857,483

(22) Filed: May 28, 2004

(65) Prior Publication Data

US 2005/0265437 A1 Dec. 1, 2005

(51) Int. Cl.
*H04B 3/46* (2006.01)
(52) U.S. Cl. ............... 375/224; 455/115.1; 702/130
(58) Field of Classification Search .......... 375/222, 375/244, 257, 223, 224; 455/73, 115.1, 562.1; 702/107, 130; 714/814
See application file for complete search history.

(56) References Cited

U.S. PATENT DOCUMENTS

| | | | |
|---|---|---|---|
| 3,155,102 A | 11/1964 | Niederer, Jr. et al. | |
| 3,638,121 A | 1/1972 | Spilker, Jr. | |
| 3,922,491 A | 11/1975 | Bjork et al. | |
| 4,384,354 A | 5/1983 | Crawford et al. | |
| 4,648,133 A | 3/1987 | Vilnrotter | |
| 4,799,165 A * | 1/1989 | Hollister et al. | 702/66 |
| 5,111,208 A | 5/1992 | Lopez | |
| 5,122,978 A | 6/1992 | Merrill | |
| 5,243,626 A | 9/1993 | Devon et al. | |
| 5,436,908 A | 7/1995 | Fluker et al. | |
| 5,485,490 A | 1/1996 | Leung et al. | |
| 5,511,091 A | 4/1996 | Saito | |
| 5,523,760 A | 6/1996 | McEwan | |
| 5,546,090 A * | 8/1996 | Roy et al. | 342/174 |
| 5,548,146 A | 8/1996 | Kuroda et al. | |
| 5,554,945 A | 9/1996 | Lee et al. | |

(Continued)

FOREIGN PATENT DOCUMENTS

JP 02000035831 A 8/1990

OTHER PUBLICATIONS

Paris, Lluis et al, "WP 24.3 A 800MB/s 72Mb SLDRAM with Digitally-Calibrated DLL," IEEE International Solid-State Circuits Conference (1999), 13 pages.

(Continued)

*Primary Examiner* — David C Payne
*Assistant Examiner* — Leon-Viet Q Nguyen
(74) *Attorney, Agent, or Firm* — Haynes Beffel & Wolfeld LLP

(57) ABSTRACT

A communication channel is operated by storing a calibrated parameter value in nonvolatile memory during manufacturing, testing, or during a first operation of the device. Upon starting operation of the communication channel in the field, the calibrated parameter value is obtained from the nonvolatile memory, and used in applying an operating parameter of the communication channel. After applying the operating parameter, communication is initiated on a communication channel. The operating parameter can be adjusted to account for drift immediately after starting up, or periodically. The process of starting operation in the field includes power up events after a power management operation. In embodiments where one component includes memory, steps can be taken prior to a power management operation using the communication channel, such as transferring calibration patterns to be used in calibration procedures.

45 Claims, 17 Drawing Sheets

U.S. PATENT DOCUMENTS

| | | | |
|---|---|---|---|
| 5,621,913 A | | 4/1997 | Tuttle et al. |
| 5,740,520 A * | | 4/1998 | Cyze et al. ............... 455/69 |
| 5,793,815 A * | | 8/1998 | Goodnow et al. ........... 375/286 |
| 5,859,881 A | | 1/1999 | Ferraiolo et al. |
| 5,963,600 A * | | 10/1999 | Rausch et al. ............. 375/344 |
| 6,047,346 A | | 4/2000 | Lau et al. |
| 6,163,570 A * | | 12/2000 | Olafsson ................ 375/223 |
| 6,173,345 B1 | | 1/2001 | Stevens |
| 6,188,721 B1 * | | 2/2001 | Shirani et al. ............. 375/232 |
| 6,219,384 B1 | | 4/2001 | Kliza et al. |
| 6,282,210 B1 | | 8/2001 | Rapport et al. |
| 6,313,868 B1 * | | 11/2001 | D'Alfonso et al. ........... 348/72 |
| 6,321,282 B1 | | 11/2001 | Horowitz et al. |
| 6,359,931 B1 | | 3/2002 | Perino et al. |
| 6,369,652 B1 | | 4/2002 | Nguyen et al. |
| 6,377,640 B2 | | 4/2002 | Trans |
| 6,396,329 B1 | | 5/2002 | Zerbe |
| 6,421,389 B1 | | 7/2002 | Jett et al. |
| 6,434,081 B1 | | 8/2002 | Johnson et al. |
| 6,442,644 B1 * | | 8/2002 | Gustavson et al. ........... 711/105 |
| 6,448,815 B1 | | 9/2002 | Talbot et al. |
| 6,463,392 B1 | | 10/2002 | Nygaard et al. |
| 6,469,555 B1 | | 10/2002 | Lau et al. |
| 6,473,439 B1 | | 10/2002 | Zerbe et al. |
| 6,484,232 B2 | | 11/2002 | Olarig et al. |
| 6,510,503 B2 | | 1/2003 | Gillingham et al. |
| 6,539,072 B1 | | 3/2003 | Donnelly et al. |
| 6,556,934 B2 | | 4/2003 | Higashide |
| 6,560,716 B1 | | 5/2003 | Gasparik et al. |
| 6,606,350 B2 | | 8/2003 | Dress, Jr. et al. |
| 6,606,576 B2 * | | 8/2003 | Sessions .................. 702/107 |
| 6,643,787 B1 | | 11/2003 | Zerbe et al. |
| 6,657,468 B1 | | 12/2003 | Best et al. |
| 6,662,305 B1 | | 12/2003 | Salmon et al. |
| 6,690,741 B1 | | 2/2004 | Larrick, Jr. et al. |
| 6,717,992 B2 | | 4/2004 | Cowie et al. |
| 6,889,357 B1 * | | 5/2005 | Keeth et al. ............... 714/814 |
| 7,082,290 B2 * | | 7/2006 | Takano et al. ............. 455/102 |
| 7,110,469 B2 * | | 9/2006 | Shi et al. ................. 375/295 |
| 7,362,826 B2 * | | 4/2008 | Willingham ............... 375/327 |
| 2001/0048382 A1 | | 12/2001 | Low et al. |
| 2001/0050952 A1 * | | 12/2001 | Nikutta .................. 375/224 |
| 2001/0053175 A1 | | 12/2001 | Hoctor et al. |
| 2001/0056332 A1 | | 12/2001 | Abrosimov et al. |
| 2002/0072870 A1 | | 6/2002 | Adam et al. |
| 2002/0105670 A1 * | | 8/2002 | Maruyama ............... 358/1.14 |
| 2002/0138224 A1 | | 9/2002 | Sessions |
| 2002/0149824 A1 | | 10/2002 | Beaulieu et al. |
| 2003/0026399 A1 | | 2/2003 | Carlson |
| 2003/0031283 A1 * | | 2/2003 | Bronfer et al. ............. 375/371 |
| 2003/0040292 A1 * | | 2/2003 | Peterzell et al. ............ 455/147 |
| 2003/0063597 A1 | | 4/2003 | Suzuki |
| 2003/0117997 A1 * | | 6/2003 | Kim ..................... 370/350 |
| 2003/0146800 A1 | | 8/2003 | Dvorak |
| 2003/0149991 A1 | | 8/2003 | Reidhead et al. |
| 2003/0161487 A1 * | | 8/2003 | Husted et al. .............. 381/94.5 |
| 2003/0198212 A1 | | 10/2003 | Hoctor et al. |
| 2003/0198308 A1 | | 10/2003 | Hoctor et al. |
| 2004/0032354 A1 | | 2/2004 | Knobel et al. |
| 2004/0057500 A1 | | 3/2004 | Balachandran et al. |
| 2004/0127260 A1 * | | 7/2004 | Boros et al. .............. 455/562.1 |
| 2004/0243326 A1 * | | 12/2004 | Daoud et al. .............. 702/65 |
| 2005/0163202 A1 | | 7/2005 | Hampel et al. |
| 2005/0185955 A1 * | | 8/2005 | French et al. ............. 398/16 |
| 2005/0221765 A1 * | | 10/2005 | Shen et al. ............... 455/73 |
| 2005/0225433 A1 * | | 10/2005 | Diorio et al. ............. 340/10.4 |

OTHER PUBLICATIONS

Nakase, Yasunobu et al, "Source-Synchronization and Timing Vernier Techniques for 1.2-GB/s SLDRAM Interface," IEEE Journal of Solid-State Circuits, vol. 34, No. 4 (Apr. 1999), 494-501.

Gillingham, Peter, "SLDRAM Architectural and Functional Overview," SLDRAM Consortium (Aug. 29, 1997), 1-14.

"Draft Standard for a High-Speed Memory Interface (SyncLink)", Draft 0.99 IEEE P1596.7-199X (1996), 56 pages.

Gillingham, Peter, "SLDRAM: High-Performance, Open-Standard Memory," IEEE (1997), 29-39.

SLDRAM Inc., "400 Mb/s/pin SLDRAM," Draft Advance (Jul. 9, 1998), 1-69.

Zerbe, Jared et al., U.S. Appl. No. 09/776,550, filed Feb. 2, 2001, entitled "Method and Apparatus for Evaluating and Calibrating a Signaling System."

Zerbe, Jared et al, U.S. Appl. No. 09/976,170, filed Oct. 21, 2001, entitled "Method and Apparatus for Evaluating and Optimizing a Signaling System."

Rambus "Direct Rambus Short Channel Layout Guide, Version 0.95" (Aug. 2001), 40 pages.

Rambus "Direct Rambus Long Channel Design Guide" (2000), 45 pages.

Intel "How to Measure RDRAM* System Clock Jitter" Application Note AP-667 (Jun. 1999), pp. 1-15.

RDRAM® Overview, "High Performance Memory Interface Solution", Copyright 2003 Rambus, Inc., all rights reserved, 4 pages.

Redwood Technology Brief "High Performance Parallel Bus Interface Technology", Copyright 2003 Rambus, Inc., all rights reserved, 2 pages.

Lewis, Dave, "Easy-to-Use LVDS Serdes for the Serdes Neophyte" National Semiconductor, (Jun. 16, 2003), pp. 1-5.

U.S. Appl. No. 10/278,478, filed Oct. 22, 2002 entitled "Timing Calibration Apparatus and Method for a Memory Device Signaling System".

Chang, Kun Yung "Design of a CMOS Asymmetric Serial Link" A Dissertation Submitted to the Department of Electrical Engineering and the Committee on Graduate Studies of Stanford University Aug. 1999, 119 pages.

U.S. Appl. No. 10/278,708, filed Oct. 22, 2002, entitled "Phase Adjustment Apparatus and Method for a Memory Device Signaling System."

Daniele, N. et al., "Principle and Motivations of UWB Technology for High Data Rate WPAN Applications," SOC 2003, 4 pages.

Win, Moe Z., et al., "Impulse Radio: How it Works," IEEE Communications Letters 2(2), Feb. 1998, 36-38.

Daniele, Norbert, "Ultra Wide Band Principles and Applications for Wireless Communications," CEA-LETI Annual Review, Jun. 25 and 26, 2002, 24 pages.

Rambus, Inc. "RDRAM Direct Rambus Clock Generator" (Apr. 2002), 22 pages.

U.S. Appl. No. 09/941,079, filed Aug. 28, 2001 entitled "Clock Data Recovery with Selectable Phase Control Input."

Yang, Chih-Kong Ken "Design of High-Speed Serial Links in CMOS" Technical Report No. CSL-TR-98-775, Sponsored By Center for Integrated Systems, Sun Microsystems and LSI Logic Inc. Dec. 1998, pp. 1-182.

RaSer™ X Product Brief, "Highly Flexible 10 Gbps Backplane Serial Link Interface," Copyright 2003 Rambus, Inc., all rights reserved, 2 pages.

Yellowstone Technology Brief, "High Performance Memory Interface Technology," Copyright 2003 Rambus, Inc., all rights reserved, 2 pages.

Widmer, A.X., et al., "A DC-Balanced, Partitioned-Block, 8B/10B Transmission Code," IBM J. Res. Develop., vol. 27, No. 5, Sep. 1983, 440-451.

Banu, Mihai, et al., "TA 6.4: A 660Mv/s CMOS Clock Recovery Circuit with Instantaneous Locking for NRZ Data and Burst-Mode Transmission," IEEE International Solid State Circuits Conference, 1993, 102-103, 270.

Eldering, Charles A., et al., "Digital Burst Mode Clock Recovery Technique for Fiber-Optic Systems," Journal of Lightwave Technology, vol. 12, No. 2, Feb. 1994, 271-279.

Chang, Ken K. Y., et al., "A 2 Gb/s Asymmetric Serial Link for High-Bandwidth Packet Switches," Hot Interconnects V, Stanford University, Aug. 1997, 1-9.

Hu, Timothy H., et al., "A Monolithic 480 Mb/s Parallel AGC/Decision/Clock-Recovery Circuit in 1.2-• CMOS," IEEE Journal of Solid-State Circuits, vol. 28, No. 12, Dec. 1993, 1314-1320.

Kim, Sungjoon, et al, "An 800Mbps Multi-Channel CMOS Serial Link with 3x Oversampling," IEEE 1995 Custom Integrated Circuits Conference, 22.7.1-22.7.4.

Nakamura, Kazuyuki, et al., "A 6 Gbps CMOS Phase Detecting DEMUX Module Using Half-Frequency Clock," 1998 Symposium on VLSI Circuits Digest of Technical Papers, 196-197.

Poulton, John, et al., A Tracking Clock Recovery Receiver for 4Gb/s Signaling, Hot Interconnects '97, Aug. 21-23, 1997, Palo Alto, CA, 1-13.

Dally, W, et al., "Digital Systems Engineering," Cambridge University Press, 1998, pp. 447-449.

Cerisola, M., et al., "CORD—a WDM Optical Network: Control Mechanism Using Subcarrier Multiplexing and Novel Synchronization Solutions," Communications, 1995. ICC 95 Seattle, Gateway to Globalization, 1995 IEEE International Conference on, vol. 1, Jun. 18-22, 1995 pp. 261-265 vol. 1.

EIA/JEDEC Standard No. 8-B (JESD8-B) "Interface Standard for Nominal 3 V/3.3 V Supply Digital Integrated Circuits," (Sep. 1999) 12 pages.

EIA/JEDEC Standard No. 8-6 (EIA/JESD8-6) "High Speed Transceiver Logic (HSTL) A 1.5 V Output Buffer Supply Voltage Based Interface Standard for Digital Integrated Circuits," (Aug. 1995) 16 pages.

JEDEC Standard—JESD8-16 "Bus Interconnect Logic (BIC) for 1.2 Volts," (Apr. 2004) 16 pages.

* cited by examiner

COMMUNICATION CHANNEL CALIBRATION WITH NONVOLATILE PARAMETER STORE FOR RECOVERY

BACKGROUND OF THE INVENTION

1. Field of the Invention

The present invention relates to calibration of communication channel parameters in systems, including mesochronous systems, in which two (or more) components communicate via an interconnection link; and to calibration to account for drift of conditions related to such parameters during operation of the communication channels.

2. Description of Related Art

In high-speed communication channels which are operated in a mesochronous manner, typically a reference clock provides frequency and phase information to the two or more components on the link. A transmitter on one component and a receiver on another component each connect to the link. The transmitter and receiver operate in different clock domains, which have an arbitrary (but fixed) phase relationship to the reference clock. The phase relationship between transmitter and receiver is chosen so that the propagation delay seen by a signal wavefront passing from the transmitter to the receiver will not contribute to the timing budget when the signaling rate is determined. Instead, the signaling rate will be determined primarily by the drive window of the transmitter and the sample window of the receiver. The signaling rate will also be affected by a variety of second order effects. This system is clocked in a mesochronous fashion, with the components locked to specific phases relative to the reference clock, and with the drive-timing-point and sample-timing-point of each link fixed to the phase values that maximize the signaling rate.

These fixed phase values may be determined in a number of ways. A sideband link may accompany a data link (or links), permitting phase information to be passed between transmitter and receiver. Alternatively, an initialization process may be invoked when the system is first given power, and the proper phase values determined by passing calibration information (patterns) across the actual link. Once the drive-timing-point and sample-timing-point of each link has been fixed, the system is permitted to start normal operations.

However, during normal operation, system and environmental conditions will change. Ambient temperature, humidity, component temperature, supply voltages, and reference voltages will drift from their initial values. Many of the circuits in the components will be designed to be insensitive to drift within a specified range, but the drift will need to be considered when setting the upper signaling rate of a link.

As the conditions drift, the optimal timing points of the transmitter and receiver will change. If the timing points remain at their original values, then margin must be added to the timing windows to ensure reliable operation. This margin will reduce the signaling rate of the link.

Another problem arises during power down events, which occur under typical power loss scenarios, and increasingly under power management schemes that preserve battery power. After power down, the communication channel must be recalibrated. The recalibration process after loss of power presents a type of "chicken and egg" problem, where communication across the channel must take place before calibration. But calibration of the bus must be completed before communication can take place. Thus, brute force calibration routines are necessary to scan the available settings in order to reestablish and recalibrate communication on the channel. These brute force calibration routines are lengthy, and consume a significant portion of time used by the initialization process after power down events. The delay caused by the initialization process can be a significant factor in system performance.

It is desirable to provide techniques for calibration of communication channels which provide more efficient utilization of system resources after power down.

SUMMARY OF THE INVENTION

The present invention provides a method for calibrating a communication channel coupling first and second components during restart operations which occur for example after power down events. According to the method, after assembly of a communication channel, upon power up a calibration process is executed to determine one or more calibrated parameter values for the communication channel. The calibrated parameter values are then stored in nonvolatile memory, which is accessible by at least one of the first and second components, where nonvolatile memory is provided by a memory device or other storage that maintains data during power down events. Upon restarting the communication channel in the field, such as upon a power up event after a power management operation, or after other loss of power events, the procedure includes obtaining the calibrated parameter value in the nonvolatile memory, and setting an operating parameter of the communication channel using the calibrated parameter value. The communication channel is then enabled for communicating data very quickly, without requiring exhaustive calibration operations.

According to embodiments of the invention, power up events later than the first restarting are executed in a similar manner, accessing the calibrated parameter value in the nonvolatile memory, and setting an operating parameter for the communication channel using the parameter. According to yet other embodiments, after restarting the communication channel using calibrated parameter values from nonvolatile memory, the operating parameter is adjusted to account for changes in environmental conditions. The adjustment is executed using another calibration process, designed for example to track drift, that includes transmitting a calibration pattern from the first component and receiving the calibration pattern in the second component after setting the operating parameter to the calibrated parameter value. The calibration process executed in the field can be less exhaustive, and utilize less resources of the communication channel in terms of time and bandwidth, than would be required for the initial exhaustive calibration process, without reliance on a calibrated parameter value obtained from nonvolatile memory. Use of "in the field" in the context of the present description, refers to use of the communication channel for communication, by example by end users, OEMs, and others who have obtained an assembled product.

The present invention is also embodied by a method for operating a communication channel including storing a calibrated parameter value in nonvolatile memory, starting operation of the communication channel, including obtaining the calibrated parameter value from the nonvolatile memory, and applying an operating parameter of the communication channel that is equal to or based on the calibrated parameter value. After applying the operating parameter, communication is established on the communication channel. The operating parameter is adjusted to account for changes in environmental conditions which have an effect on the communication channel, immediately after starting up, or periodically as suits the needs of the particular implementation. In embodiments of the invention, starting operation of the communication channel as just described is executed in the field, while the process of storing a calibrated parameter value in nonvolatile memory is executed during at least one of manufacturing or testing of the device.

In yet another embodiment, the present invention comprises a system interface. The system includes a plurality of communication channels. Nonvolatile memory stores a plurality of calibrated parameter values for the communication channels. A plurality of interface modules is adapted to be connected to the communication links in corresponding communication channels in the system. Interface modules include at least one of the transmitter and receiver, and are responsive to an operating parameter. Logic is included in or coupled with the interface that is executed on starting field operation of the system. The logic accesses the calibrated parameter values in the nonvolatile memory, and sets the operating parameters of the interface modules in the plurality of interface modules using the calibrated parameter values.

In various embodiments of the present invention, the calibrated parameter value stored in nonvolatile memory, comprises one or both of the drive timing point and sample timing point for the transmitter and receiver respectively on the first component, and one or both of the drive timing point, and a sample timing point for the transmitter and receiver respectively on the second component. Other calibrated parameters for the communication channel can be managed according to the present invention, including parameters that set voltages and timings for various other signals, drivers and samplers, which relate to various adjustable aspects of the communication channel.

The communication channel is coupled, in various embodiments of the invention, with nonvolatile memory in a variety of configurations. In one example, the nonvolatile memory comprises a centralized read-only memory array storing calibrated parameter values for a plurality of I/O ports on a plurality of components. In other embodiments, the nonvolatile memory comprises nonvolatile memory arrays integrated on the first component, and stores calibrated parameter values for the I/O ports on the first component only. In yet other embodiments, the nonvolatile memories are distributed among the I/O ports on the components.

The invention also includes embodiments in which the first component acts as a master for the calibration routine, and the second component acts as a slave. The second component may comprise a DRAM or other memory device which is protected from power down events during power management and the like, so that memory refresh operations and the like are maintained. According to this embodiment, significant resources in the communication channel, or time required for restarting the system, can be saved by anticipating a power down event, and transferring calibration patterns from the first component to the second component using the high-speed bus subject of the calibration process, and interconnecting the components. After restarting the communication channel, the second component is preloaded with calibration patterns. The first component instructs the second component to transmit the pre-loaded calibration patterns according to the calibration routine.

Other aspects and advantages of the present invention can be seen on review of the drawings, the detailed description and the claims, which follow.

DETAILED DESCRIPTION

A detailed description of embodiments of the present invention is provided with reference to the FIGS. 1-17.

Figure 1:
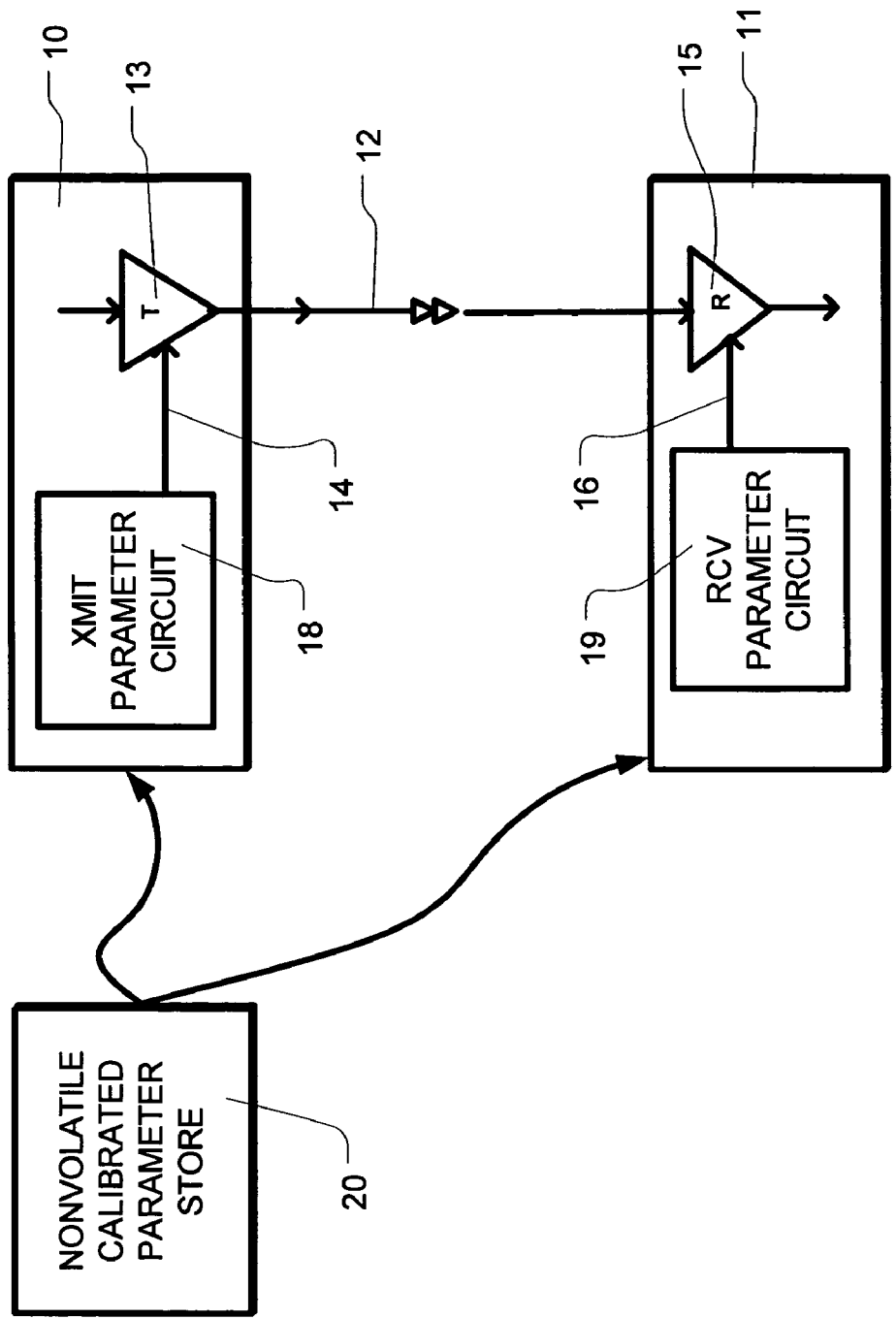
FIG. 1 is a simplified diagram of two components interconnected by a communication channel, with a nonvolatile parameter store according to the present invention.

FIG. 1 illustrates in a simplified schematic form, a first component 10 which is coupled to a second component 11 by a communication channel which includes a transmitter 13 on the first component 10, a communication link 12, and a receiver 15 on the second component 11. A transmit parameter circuit 18 is included on the first component 10. Likewise a receive parameter circuit 19 is included on the second component 11. The transmit parameter circuit 18 is used to produce a transmit clock CLKT on line 14, which is connected to the transmitter 13. The receive parameter circuit 19 is used to produce a receive clock CLKR on line 16, which is connected to the receiver. A nonvolatile store 20 holding calibrated parameter values is coupled to the first component 10 and a second component 11. The first component 10, the communication link 12 and the second component 11 are assembled during manufacturing, and may consist for example of a first integrated circuit including the first component 10, a transmission line linking the first component 10 and second component 11, and a second integrated circuit including a second component 11. In representative embodiments, the first and second integrated circuits may be on a single printed circuit board, with the transmission line comprising printed circuit board traces. In other representative embodiments, the first and second integrated circuits may be on separate boards in a rack, and the transmission line may comprise backplane cabling in the form of twisted-pair or optical fiber links. Although the illustration shows only unidirectional communication, the invention is applied for examples, to unidirectional, bidirectional and multidrop links.

When the first component and the second component start up, calibrated parameter values are downloaded from the nonvolatile calibrated parameter store 20, and stored in the transmit parameter circuit 18 and the receive parameter circuit 19, respectively. In the illustrated embodiment, the nonvolatile store 20 is external to the first component 10 and the second component 11. In other embodiments, nonvolatile parameter stores may be integrated on the first and second components 10, 11, for example using random-access flash memory arrays on the integrated circuit with the first component 10 and on the integrated circuit with the second component 11, or for an alternative example, using distributed nonvolatile registers comprising read-only memory cells coupled with the transmit parameter circuit 18 and the receive parameter circuit 19.

Using the calibrated parameters from the nonvolatile store 20, the communication channel is able to operate essentially immediately upon power up. This enables the communication channel to bypass brute force calibration routines required in the prior art after power down events and the like in which the values in the transmit parameter circuit 18 and/or the receive parameter circuit 19 are lost or rendered unreliable. Fine-tuning of the transmit and receive parameters can be accomplished by relatively simple calibration routines designed to detect drift, or which otherwise utilize less of the resources of the communication channel than the brute force routine.

Thus, the nonvolatile calibrated parameter store 20 is used to store calibrated parameters that are generated using exhaustive calibration routines one time, such as during manufacturing or during testing. Later operations starting up the communication channel in the field bypass the exhaustive calibration routines, allowing more efficient utilization of communication resources.

Figure 2:
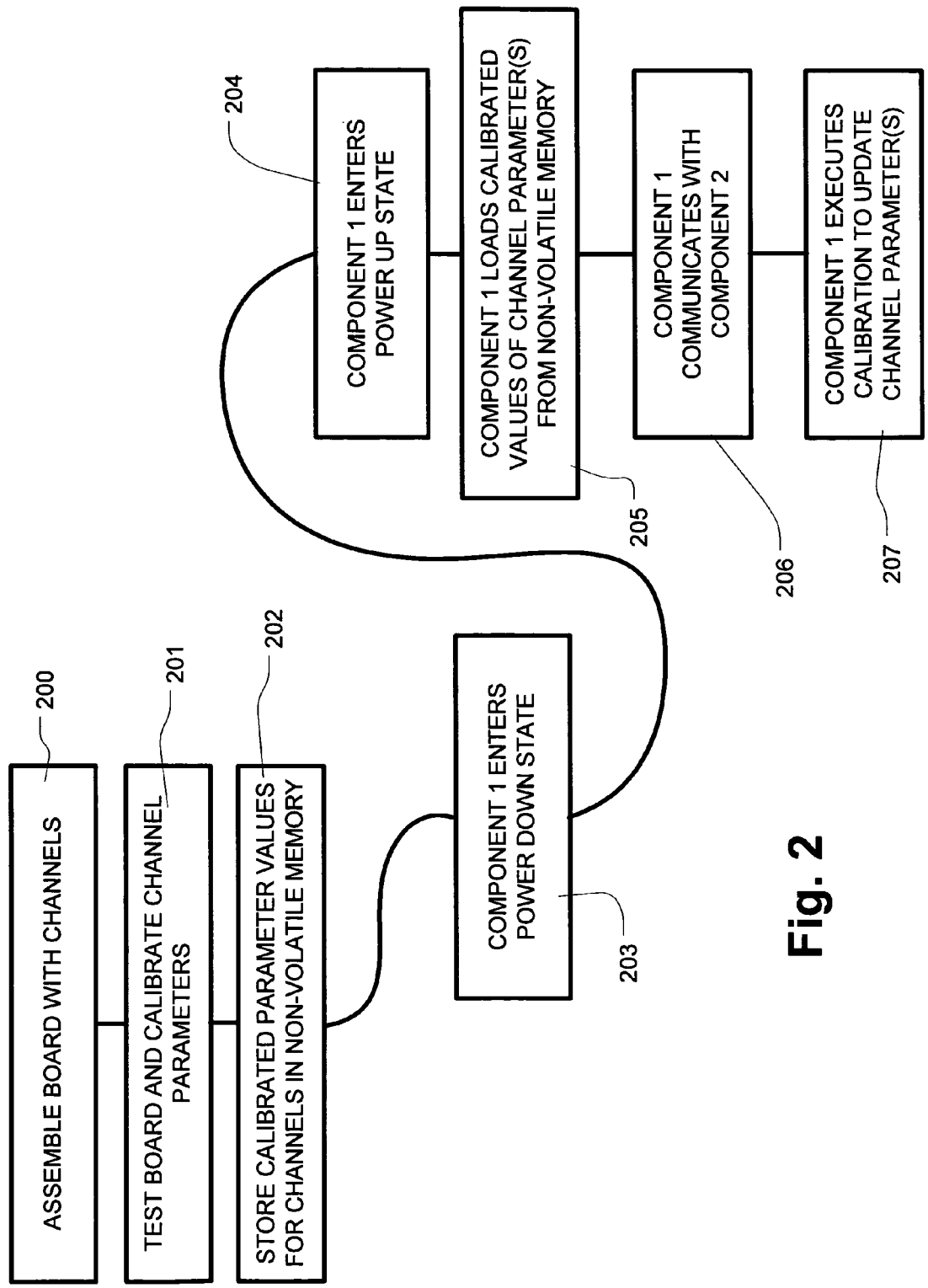
FIG. 2 is a simplified flow chart for a basic process of the present invention applying calibrated parameter values during recovery from power down events on the communication channels.

FIG. 2 shows a basic procedure according to the present invention with reference to the simplified schematic of FIG. 1. As summarized above, during manufacturing a device, such as a printed circuit board or a set of boards, which includes integrated circuits and communication channels is assembled (step 200). After assembly of the device, the device is tested and channel parameters are calibrated using exhaustive, brute force calibration routines which are designed to find a center operating point which can be reliably used to establish communication on the channels in the field (step 201). After calibration, the calibrated parameter values for the channels are stored in nonvolatile memory (step 202). During field operation, a first component, "component 1" on the device enters a power down state, for example during power management operations to save power, or enters some other state in which the communication channel parameters are lost or rendered unreliable (step 203). Later, component 1 on the device enters a power up state, or some other state which requires restarting communication with component 2 (step 204). Upon restarting communication, component 1 loads the calibrated values of the channel parameters from the nonvolatile memory (step 205). After loading the calibrated values of the communication channel parameters, component 1 and component 2 are able to communicate (step 206). Later, or at any time after establishing communication with component 2, component 1 executes a calibration routine which updates the channel parameters to account for current operating conditions (step 207). The calibration routine executed in the field can be less exhaustive than that used to establish the working parameters that are stored in the nonvolatile memory. Also, the calibration routine executed in the field can use less resources of the communication channel than would otherwise be required.

Figure 3:
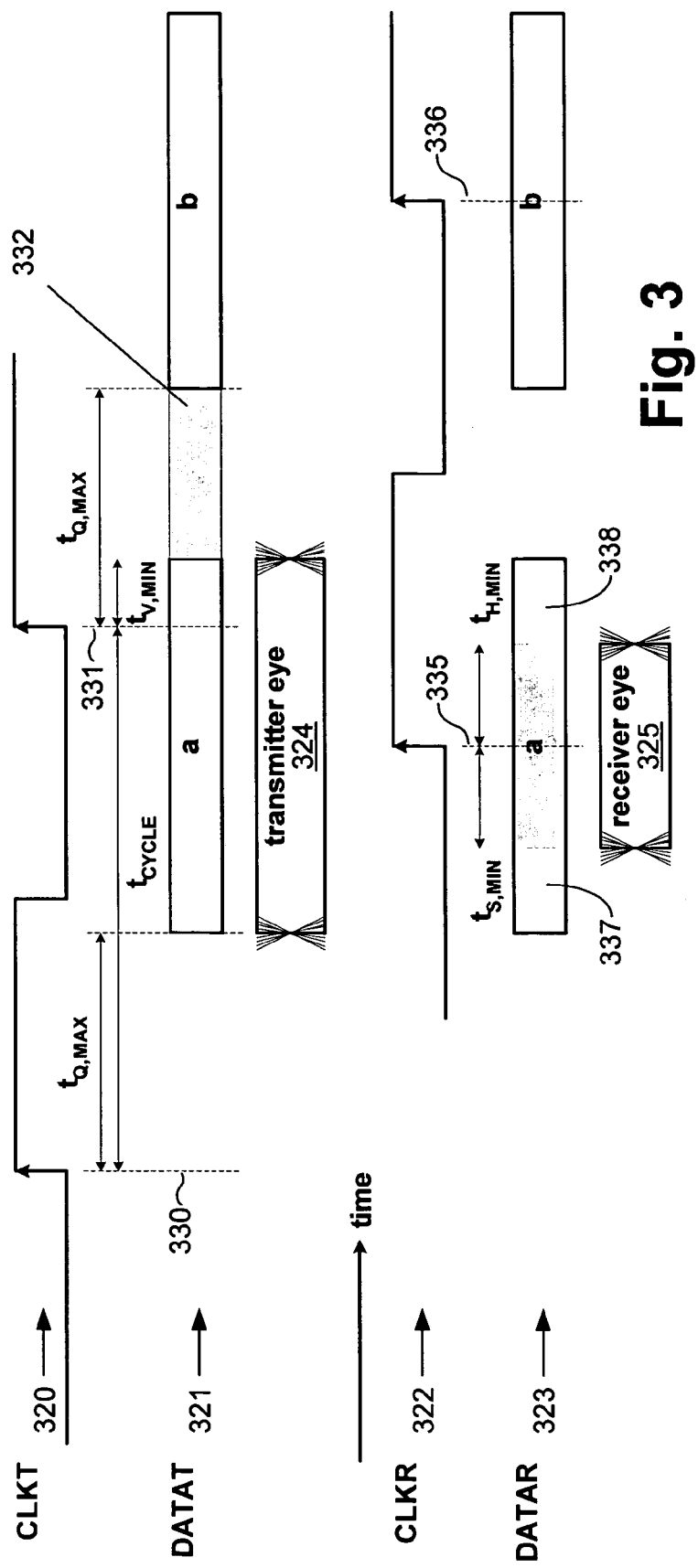
FIG. 3 is a timing diagram illustrating timing parameters for a communication channel like that shown in FIG. 1.

For the purpose of illustrating one example application of the present invention, FIG. 3 illustrates representative timing parameters for a mesochronous channel, including the transmit clock CLKT signal on trace 320, the transmitter signal DATAT on trace 321, the receive clock CLKR signal on trace 322, and the receiver signal DATAR on trace 323. The transmitter eye 324 and the receiver eye 325 are also illustrated.

The transmitter 13 will begin driving a bit (labeled "a") no later than a time $t_{Q,MAX}$ after a rising edge transition 330 of CLKT, and will continue to drive it until at least a time $t_{V,MIN}$ after the next rising edge transition 331. $t_{Q,MAX}$ and $t_{V,MIN}$ are the primary timing parameters of the transmitter 13, and determine an optimal transmitter drive point. These two values are specified across the full range of operating conditions and processing conditions of the communication channel. As a result, $t_{Q,MAX}$ will be larger than $t_{V,MIN}$, and the difference will represent the dead time or dead band 332 of the transmitter 13. The transmitter dead band 332 ($t_{DEAD,T}$) is the portion of the bit timing window (also called bit time or bit window) that is consumed by the transmitter 13:

$$t_{DEAD,T} = t_{Q,MAX} - t_{V,MIN}$$

The edges of the timing window around transition 331 can be defined by:

$$t^{-1} + t_{Q,MAX}, \text{ and}$$

$$t + t_{V,MIN},$$

where $t^{-1}$ is transition 330 one clock cycle earlier than the transition 331, and t is the transition 331.

The receiver 15 will begin sampling a bit (labeled "a") no earlier than a time $t_{S,MIN}$ before a rising edge transition 335 (or 336) of CLKR, and will continue to sample until no later than a time $t_{H,MIN}$ after the rising edge transition 335. $t_{S,MIN}$ and $t_{H,MIN}$ are the primary timing parameters of the receiver circuit, and determine an optimal receive sample point. These two values are specified across the full range of operating conditions and processing conditions of the circuit. The sum of $t_{S,MIN}$ and $t_{H,MIN}$ will represent the dead time or dead band 337, 338 of the receiver. The receiver dead band 337, 338 ($t_{DEAD,R}$) is the portion of the bit timing window (also called bit time or bit window) that is consumed by the receiver circuit:

$$t_{DEAD,R} = t_{S,MIN} + t_{H,MIN}$$

The edges of the timing window around transition 335 can be defined by:

$$t - t_{S,MIN}, \text{ and}$$

$$t + t_{H,MIN},$$

where t is transition 335.

In this example, the bit timing window is one $t_{CYCLE}$ minus the $t_{DEAD,T}$ and $t_{DEAD,R}$ values, each of which is about ⅓ of one $t_{CYCLE}$ in this example. The remaining ⅓ $t_{CYCLE}$ would account for other uncertainty. Such uncertainty could include, for example, variation in the placement of the rising edges of CLKT and CLKR. In some systems, this variation might be specified as part of the $t_{DEAD,T}$ and $t_{DEAD,R}$ definition. Other uncertainty could include variation in the propagation delay across the interconnection medium.

Figure 4:
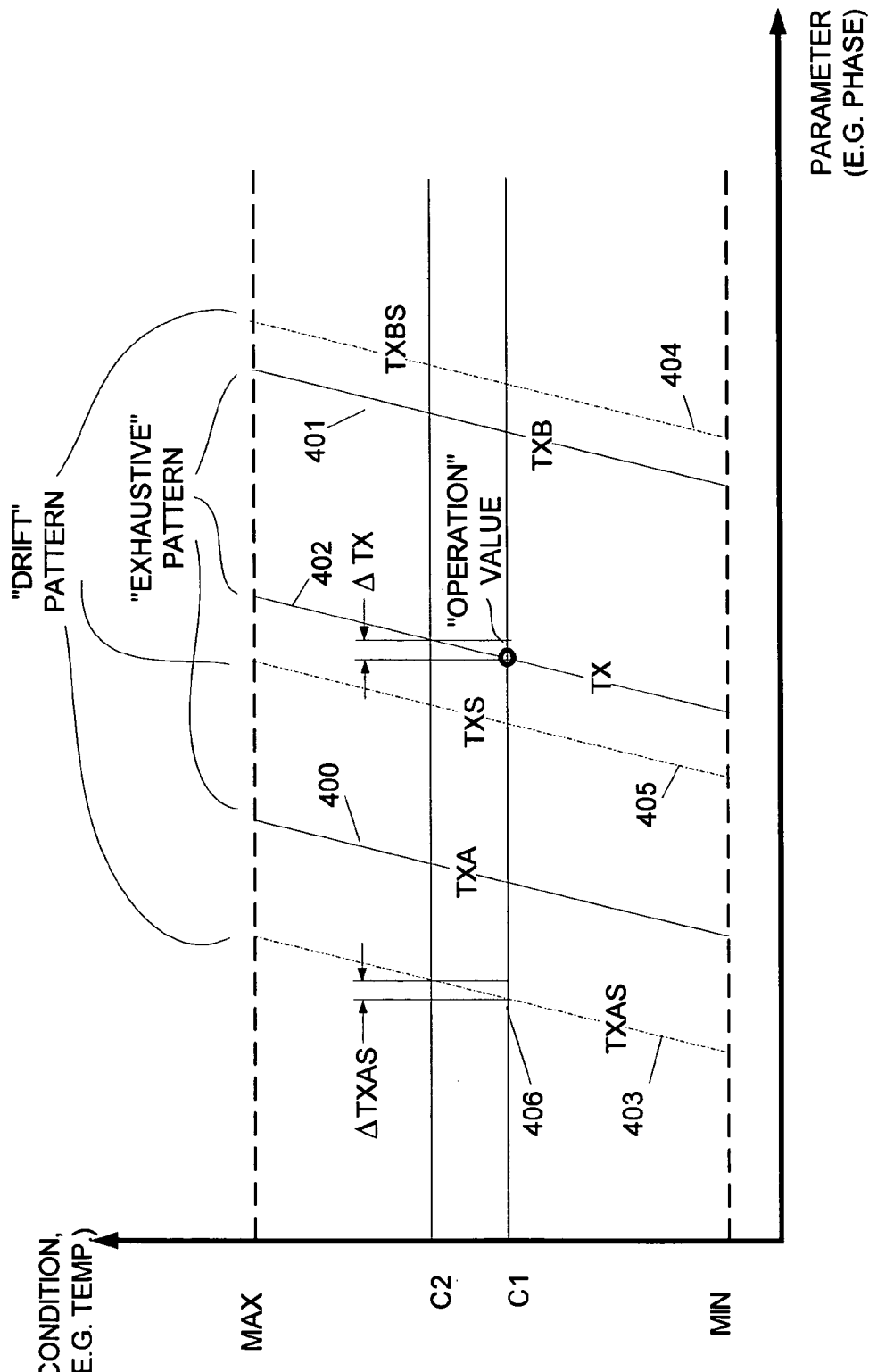
FIG. 4 illustrates variation in transmitter drive points during field operation of a communication channel.

FIG. 4 is a chart illustrating the measured values of a transmit drive timing point parameter using an exhaustive calibration sequence, as compared to the measured values of the same parameter using a calibration sequence designed to detect drift as discussed above. In FIG. 4, the conditions causing drift are plotted on the vertical axis, while the changes in the parameter are plotted on the horizontal axis. In the example illustrated, the condition causing drift is temperature, and the parameter being measured is the phase of the transmitter drive point TX. As illustrated, the exhaustive calibration sequence computes edge values TXA and TXB on traces 400 and 401, so that the operation value TX as shown on trace 402 can be computed as a function of the edge values. In this case, the exhaustive calibration sequence utilizes a long calibration pattern while the parameter being calibrated is scanned throughout its specified range, in one embodiment. Using a long pseudorandom bit sequence, the exhaustive center of the edge values TXA, TXB and the operation value TX are determined. In FIG. 4, the calibration sequences used to track drift, scan the parameter being calibrated over more limited ranges, which can be determined by the starting point retrieved from the nonvolatile calibrated parameter store. Thus, the calibration routines used to track drift take less time and use less resources of the communication channel than the more exhaustive brute force technique used to determine the calibrated parameter for the nonvolatile store. Other techniques can be used to conserve resources during the calibration routine used to track drift. For example shorter calibration sequences might be used. In the graphed example, the edge values TXAS and TXBS as measured using the calibration sequences to track drift are plotted on traces 403 and 404, and differ slightly from those of TXA and TXB which would be determined using the more exhaustive calibration routine. The operation value TXS, if it were based simply on the edge values TXAS and TXBS for the short calibration sequences, would be on the trace 405. However, as shown in FIG. 4, the relationship between the condition on the vertical axis and the edge values TXAS, TXBS for the calibration patterns used to detect drift along the horizontal axis has the same slope as the relationship between the condition and the operation value TX determined using the long calibration patterns. As shown in FIG. 4, if at calibration point C1, the operation value is established at TX, the edge value for TXAS determined using the drift routine has the value represented by point 406. At calibration point C2, the edge value TXAS drifts from point 406 on the horizontal axis by a drift value ΔTXAS. Likewise, the operation value TX drifts by a drift value ΔTX. To the extent the slope of trace 402 for the value TX is the same as, or otherwise correlates with, the slope of trace 403 for the value TXAS, the drift value ΔTXAS can be applied directly to estimate the drift ΔTX, and to update the operation value TX without executing an exhaustive calibration sequence. A similar relationship exists in the graph of FIG. 4, between TXAB and TX, and between TXS and TX. That is the drift of TX is a function of the drift of TXAS alone, TXBS alone, or of a combination of TXAS and TXBS. Thus, by measuring changes in one or both of the edge values of the parameter using a calibration routine designed to detect drift, and applying those changes to changing the operation value computed using a more exhaustive calibration routine, the operational center for the parameter can be adjusted to account for drift utilizing less resources of the communication channel. In other embodiments, the calibration routine used to detect drift may be accurate enough that its results may be used directly, overriding the results of the more exhaustive routine run to establish the calibrated parameter value in the nonvolatile store.

Figure 5:
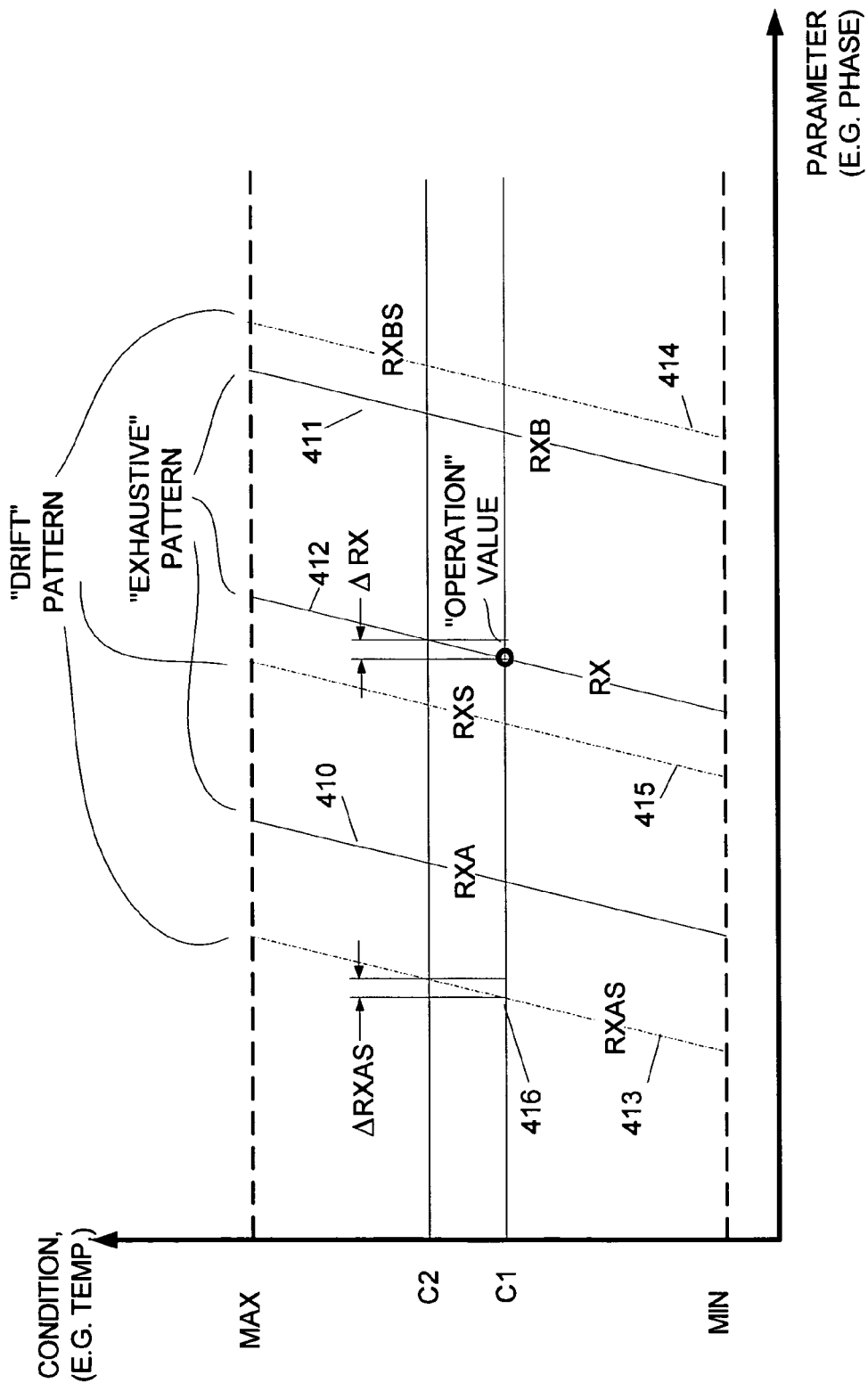
FIG. 5 illustrates variation in receiver sample points during field operation of a communication channel.

FIG. 5 is a chart illustrating the measured values of a receive sample timing point parameter using an exhaustive calibration sequence, as compared to the measured values of the same parameter using a calibration routine designed to detect drift. In FIG. 5, the conditions causing drift are plotted on the vertical axis, while the changes in the parameter are plotted on the horizontal axis. In the example illustrated, the condition causing drift is temperature, and the parameter being measured is the phase of the transmitter drive point RX. As illustrated, the exhaustive calibration sequence computes edge values RXA and RXB on traces 410 and 411, so that the operation value RX as shown on trace 412 can be computed as a function of the edge values and stored in the nonvolatile calibrated parameter store. In FIG. 5, the edge values RXAS and RXBS determined using the calibration sequences used to track drift are plotted on traces 413 and 414. The operation value RXS, if it were based simply on the edge values RXAS and RXBS for the drift calibration sequences, would be on the trace 415. However, as shown in FIG. 5, the relationship between the condition on the vertical axis and the edge values RXAS, RXBS along the horizontal axis has the same slope as the relationship between the condition on the vertical axis and the operation value RX determined using the long calibration patterns. As shown in FIG. 5, if at calibration point C1, the operation value is established at RX, the edge value for RXAS determined using the routine used to detect a drift has the value represented by point 416. At calibration point C2, the edge value RXAS drifts from point 416 on the horizontal axis by a drift value ΔRXAS. Likewise, the operation value RX drifts by a drift value ΔRX. To the extent the slope of trace 412 for the value RX is the same as, or otherwise correlates with, the slope of trace 413 for the value RXAS, the drift value ΔRXAS can be applied directly to estimate the drift ΔX, and to update the operation value RX without executing an exhaustive calibration sequence. A similar relationship exists in the graph of FIG. 5, between RXAB and RX, and between RXS and RX. That is, the drift of RX is a function of the drift of RXAS alone, RXBS alone, or of a combination of RXAS and RXBS. Thus, by measuring changes in one or both of the edge values of the parameter using a calibration pattern used to detect drift, and applying those changes to changing the operation value computed using a more exhaustive calibration routine, the operational center for the parameter can be adjusted to account for drift utilizing less resources of the communication channel. As mentioned before, the results of the calibration routine used to compute drift can be applied directly in other embodiments of the invention.

The functions of the drift in the edge value measured using the calibration routine used to detect drift, and the drift in the operation value using the more exhaustive calibration routine used to set that calibrated parameter in the nonvolatile store, in the examples of FIG. 4 and FIG. 5, are linear, or approximately linear. In other examples, the functions may be more complex, and/or the values measured using the drift patterns may be different than those shown. However, so long as the drift in the value measured using the drift calibration pattern, and the drift in the operation value using the long calibration pattern, are correlated, whether causally or not, then the values measured using the short calibration pattern can be applied for adjustment of the operation value of the parameter.

Accordingly, the operation value of the parameter can be established, such as by using an exhaustive calibration routine based on long calibration patterns which are scanned over the entire specified range for the parameter, during manufacturing, or on first field operation of the system, and stored in nonvolatile memory. Adjustments in the operation value due to drift, however, can be made based upon less exhaustive calibration sequences adapted to determine a drift value, such as those based on short calibration patterns which are scanned over a narrow range, where the narrow range is small compared to ranges used during initial calibration, and include possibly a single value. In general, approaches to periodic calibration that are better defined with respect to the calibrated value downloaded from the nonvolatile store and therefore take less of the resources of the channel, are used. The shorter drift calibration sequences can be executed from time to time, such as on a set periodic basis, on power up events, when signaled by an external monitor of the conditions of operation, or at times depending on other conditions of use of the communication channel, without utilizing as much of the resources of the communication channel as are needed for the more exhaustive calibration routine utilized to generate the calibrated values stored in nonvolatile memory.

Figure 6:
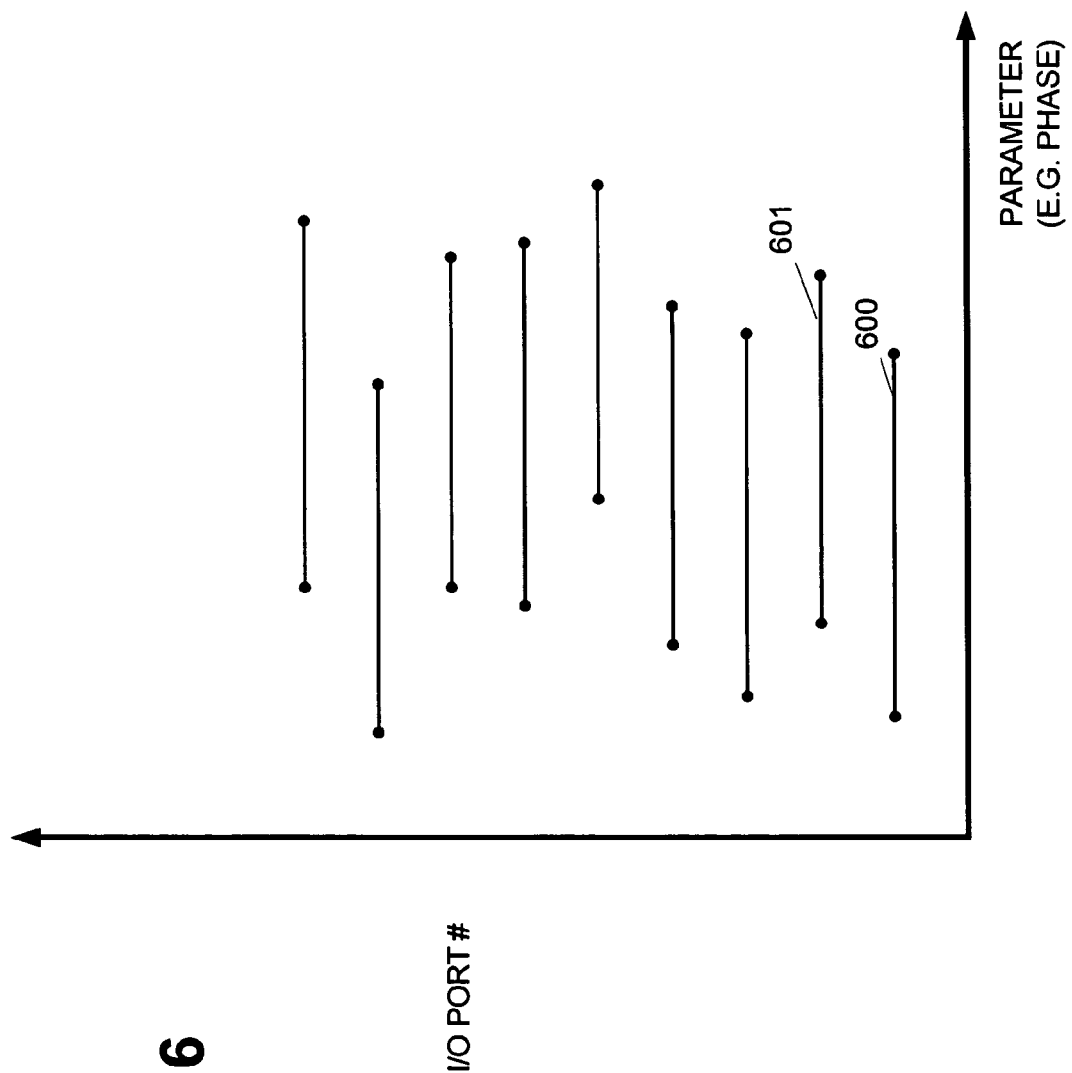
FIG. 6 is a graph showing variation in operational parameter values for I/O ports on a plurality of channels in a bus.

FIG. 6 illustrates a characteristic of bus systems including a number of I/O ports, plotted on the vertical axis, having operational windows of values for a parameter of the communication channel. As illustrated, a first I/O port may be operational in the window 600, a second I/O port may be operational in a window 601 and so on. The edge values of the windows vary significantly and the sizes of the ranges vary as well, even within a single bus system. Thus, calibrated parameter values determined in calibration after assembly are based on system configuration, and vary from port to port. However, during field use, the parameter of a given I/O port typically stays within an operational range for a given environment, and so long as the parameter is near the center of the range determined during manufacturing, and communication may be established using the calibrated parameter. Thus, a value determined for each I/O port during manufacturing can be stored in nonvolatile memory and used to recover from power down events, or other events leading to loss of parameters stored in the I/O port. Also, separate values can be stored for each I/O port. In some embodiments of the invention, a central nonvolatile memory can store a set of communication channel parameters, such as phase values for transmitter drive points and receiver sample points, for each of the I/O ports in the system. In other embodiments, distributed nonvolatile memory coupled with each integrated circuit can store a set of communication channel parameters for each of the I/O ports on the integrated circuit. In other embodiments, nonvolatile memory coupled to each I/O port can store a set of channel parameters for the corresponding I/O port.

Figure 7:
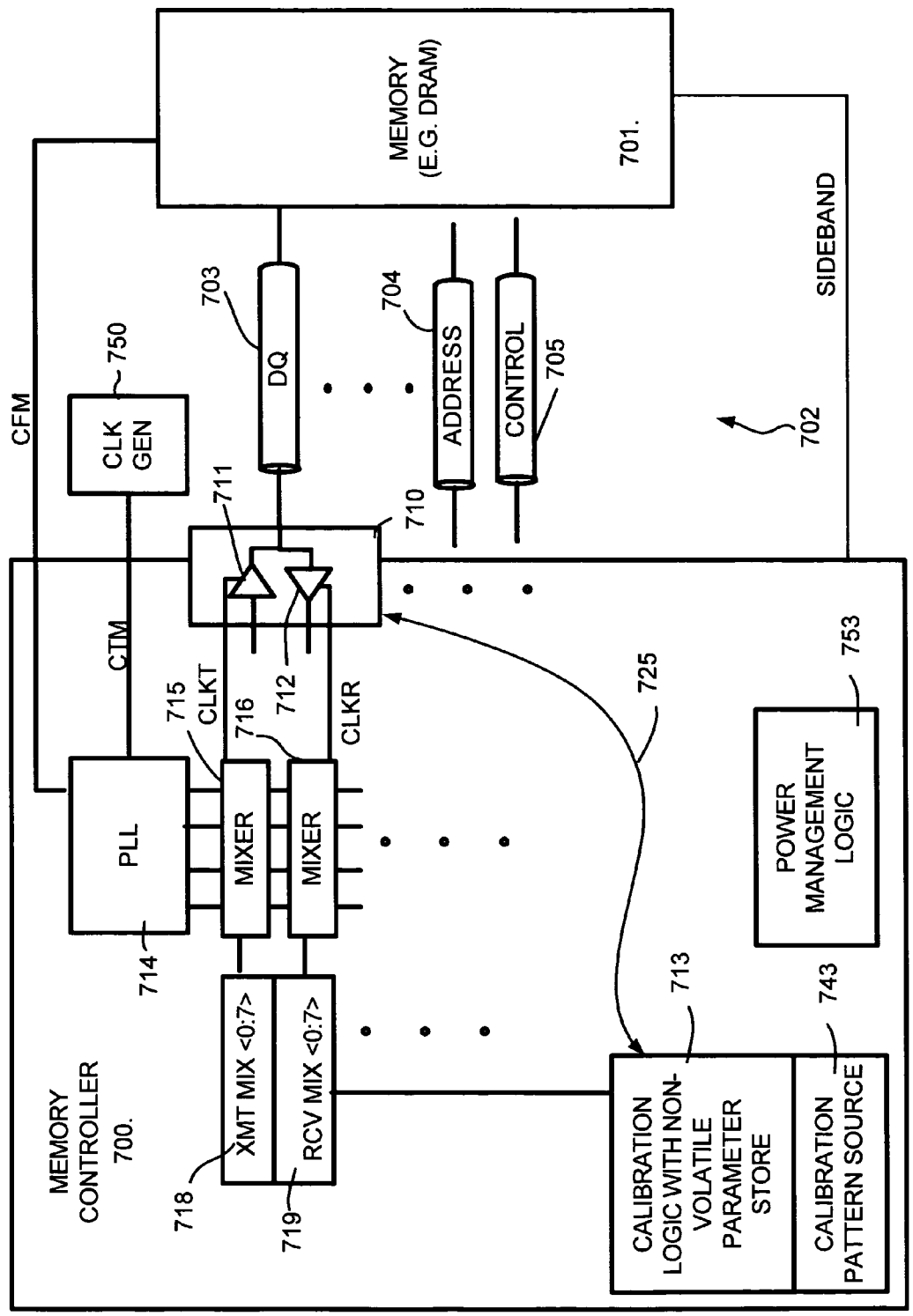
FIG. 7 is a block diagram of a system according to a representative embodiment of the present invention, including a first component having power management logic and an integrated nonvolatile parameter store communicating with a second component, such as a memory device.

FIG. 7 illustrates a system including a first integrated circuit 700 and a second integrated circuit 701, which communicate via a communication bus, generally 702. In this example, the first integrated circuit comprises a memory controller, and the second integrated circuit 701 comprises a memory device, such as a high speed DRAM. In the system of FIG. 7, a clock generator 750 is included, which provides a reference clock CTM to the master on the first integrated circuit 700. The first integrated circuit 700, in this example, repeats the reference clock as clock CFM from the master to the second integrated circuit 701.

The communication bus includes a plurality of communication channels that comprises a transmitter, a communication link and a receiver. For example, the communication bus includes a plurality of bi-directional data links represented by line 703, a plurality of bi-directional address links represented by line 704, and a plurality of bi-directional control links represented by line 705. In other embodiments, the communication bus comprises multidrop links, unidirectional links, or combinations of multidrop, uni-directional and bi-directional links.

The first integrated circuit 700 and the second integrated circuit 701 include interface I/O circuits supporting the communication bus. For simplicity, only interface circuits on the first integrated circuit 700 for the data DQ line 703 on the communication bus are shown.

The interface for the DQ line 703 includes an input/output driver 710. The input/output driver includes a transmitter 711 and a receiver 712. The transmitter 711 accepts input from a normal path used for the mission function of the first integrated circuit 700 and drives the corresponding data on the communication line 703. A transmit clock CLKT is coupled to the transmitter 711 and sets a drive timing point. A receiver (not shown) on the second integrated circuit 701 samples the data from the line 703 in response to a corresponding receive clock. The drive timing point on the transmitter 711 is set by calibration logic 713, so that the receiver on the second integrated circuit 701 is able to capture correct data.

Likewise, a receive clock CLKR is coupled to the receiver 712, and sets a sample timing point. The sample timing point is set by the calibration logic 713, in cooperation with a transmitter (not shown) on the second integrated circuit 701 in exemplary embodiments.

The transmit clocks and the receive clocks are produced by clock generator circuits. The clock generator circuits include a phase locked loop 714, which produces a set of reference clocks, and supplies those clocks to mixers 715, 716, . . . , in the interface. The mixer 715 is used for generating the transmit clock in response to a mixer control signal XMIT MIX <0:7> stored in register 718. The mixer 716 is used for generating the receive clock in response to a mixer control signal RCV MIX <0:7> stored in register 719. In the illustrated embodiment, registers 718 and 719 are managed by the calibration logic 713. In alternative embodiments, the registers could be managed by higher-layer circuits which implement the equivalent of the calibration logic 713 in software, or in a combination of software and circuits.

Input/output drivers, like driver 710, are coupled to each of the links in the communication bus, to the calibration logic 713 (schematically illustrated by line 725), and to corresponding registers, like registers 718, 719, storing the parameters of the corresponding channels.

The calibration logic 713 may include additional registers, such as registers storing edge values for use during calibration routines as described below, in addition to registers storing the operation value for each of the clocks. The registers 718, 719 are loaded by the calibration logic 713 to control operations on the corresponding channels during calibration loads and normal operational modes and so on.

During calibration routines, the calibration logic 713 obtains calibration patterns from a calibration pattern source 743, such as a pseudorandom bit sequencer, a memory storing patterns, a computer program producing patterns and the like. Calibration patterns are transmitted across the links as described above to perform calibration procedures used to track drift. In some embodiments, exhaustive calibration procedures are also executed using the calibration logic 713 during manufacturing or testing, or at other times, and used to store calibrated parameter values in nonvolatile memory. However, in some embodiments, the more exhaustive calibration procedures may be executed under the control of manufacturing and test equipment in a manufacturing, assembly or testing site.

In the embodiment of FIG. 7, power management logic 753 is included on the integrated circuit 700. The power management logic 753 manages power consumption on the communication channels, using sleep modes or "nap" modes in which power is disconnected from the calibration logic and the drivers in the channels, and which among other types of events may cause loss of the contents of registers 718, 719, or otherwise render the channel parameters in the registers 718, 719 unreliable. During events causing the communication channel to wake up under the control the power management logic 753, the power management logic 753 may signal the calibration logic 713 to indicate that reloading of the calibrated parameter values from the nonvolatile parameter store should be executed.

In the embodiment of FIG. 7, the calibration logic 713 includes an integrated nonvolatile parameter store. As discussed above, in other embodiments the calibration logic retrieves calibrated parameters from an external nonvolatile calibrated parameter store, and includes logic, or access to logic, used to obtain the parameters from the external store.

Figure 8:
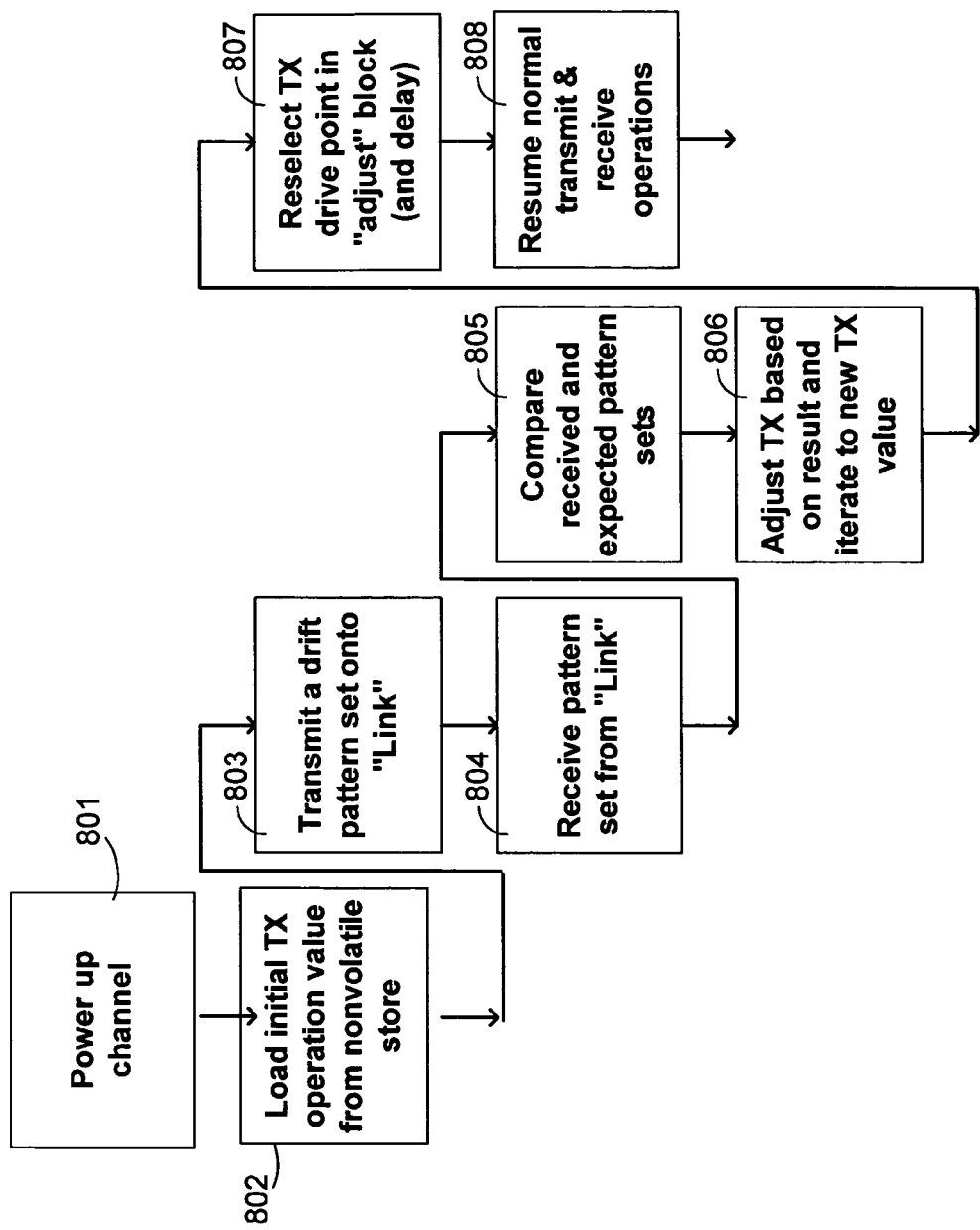
FIG. 8 is a flow chart illustrating representative calibration steps for a transmitter on a unidirectional link for a transmitter drive point.

FIG. 8 shows, for a system like the example from FIG. 7, the steps used to perform a timing calibration update in the field using a calibration routine executed after powering up the communication channel, and designed to detect drift from the calibrated parameter.

(Step 801) Power up the communication channel.
(Step 802) Load the calibrated TX drive point of the transmit component from the nonvolatile store.
(Step 803) A calibration routine used to detect drift from the calibrated TX drive point is executed, including obtaining a drift calibration pattern set from the source of calibration patterns, and transmitting the pattern set onto the "link" using the TX drive point.
(Step 804) The pattern set is received in the receive component. Note that the receiver is on a memory device that may be protected from the power down event, or, alternatively, the sample point of the receiver may be fixed relative to the reference clock of the system. In other embodiments, the sample point of the receiver may have also been retrieved from the nonvolatile store in response to a power up event.
(Step 805) The received pattern set is compared to the expected pattern set. The two pattern sets will either match or not match. As a result of this comparison (and possibly other previous comparisons) information about the calibration process is determined.
(Step 806) Adjust TX in the transmit component as a result of the calibration determination, and iterate to determine a new TX value. The new value for TX is determined in this iterative step. The pattern set may be transmitted many times while scanning the TX parameter, and results of the comparison stored in order to iteratively establish a necessary adjustment. For example, adjustment may only be made after a calibration sequence including successful transmission of two or more calibration patterns have been executed, in order to ensure some level of repeatability.
(Step 807) Change the drive point of the transmitter to the new TX operation value (used for normal operations). It may be necessary to impose a settling delay at this step to allow the new drive point to become stable.
(Step 808) Resume normal transmit and receive operations.

Figure 9:
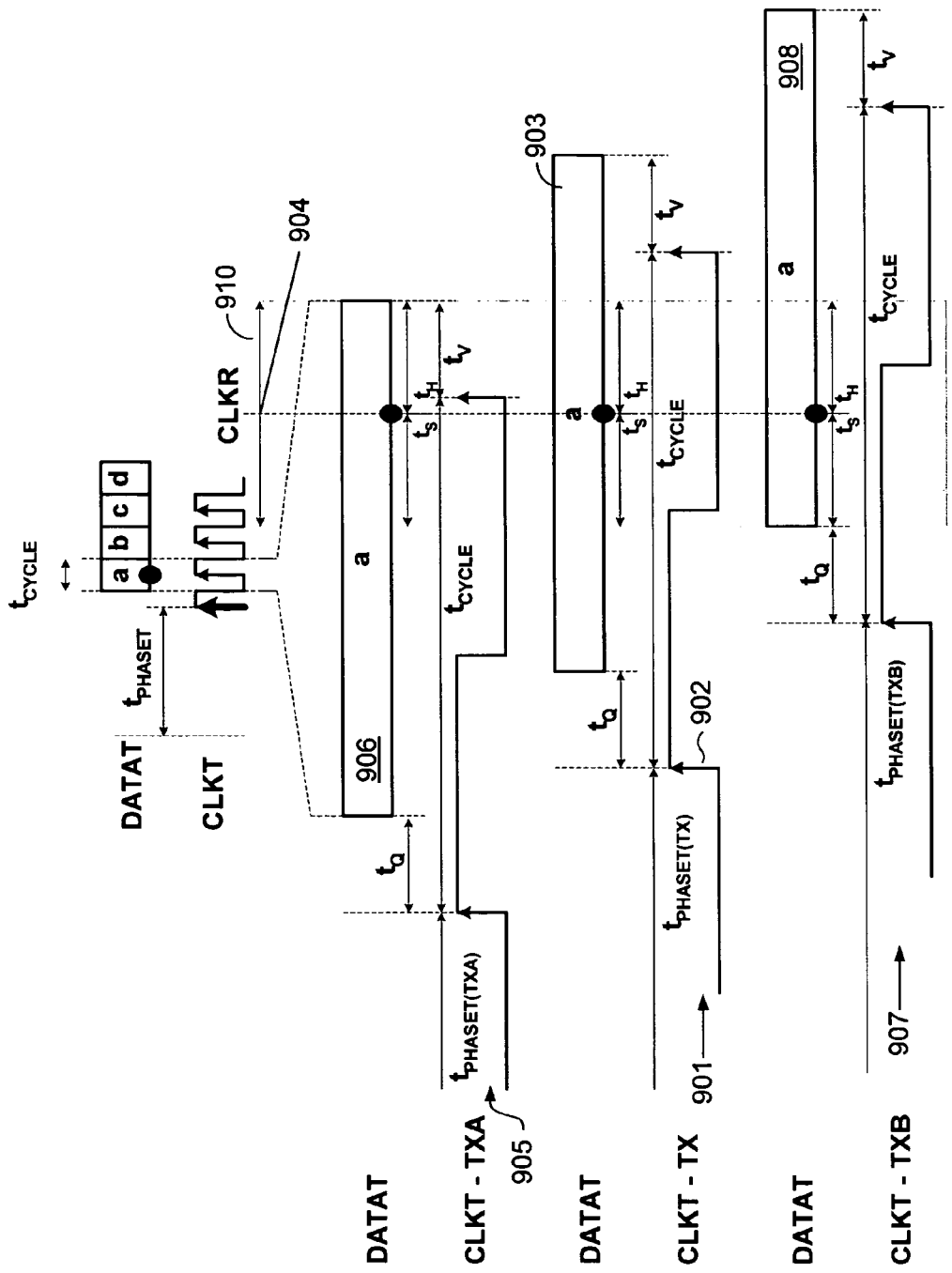
FIG. 9 illustrates timing for iteration steps for one approach to calibrating a transmitter drive point.

FIG. 9 includes the timing waveforms used by a representative calibration routine, including the calibration steps of FIG. 8 for a system like that of FIG. 7. These timing waveforms are similar to those from FIG. 3, except that the drive point is adjusted to straddle the sampling window of the receiver in order to track the edges of the valid window of the transmitter.

The calibration logic in this example maintains three values in storage: TXA, TX, and TXB. The TX value is the operation value used for normal operation. The TXA and TXB are the "edge" values, which track the left and right extremes of the bit window of the transmitter. Typically, the TX value is derived from the average of the TXA and TXB values, but other relationships are possible. The TXA and TXB values are maintained by the calibration operations, which from time to time, and periodically in some embodiments, interrupt normal operations.

In FIG. 9, the position of the rising edge of CLKT has an offset of $t_{PHASET}$ relative to a fixed reference (typically a reference clock that is distributed to all components).

When the TX value is selected ($t_{PHASET(TX)}$ in the middle trace 901 showing CLKT timing waveform) for operation, the rising edge 902 of CLKT causes the DATAT window 903 containing the value "a" to be aligned so that the DATAR signal (not shown but conceptually overlapping with the DATAT signal) at the receiving component is aligned with the receiver clock, successfully received, and ideally centered on the receiver eye.

When the TXA value is selected ($t_{PHASET(TXA)}$ in the top trace 905 showing CLKT timing waveform), the rising edge of CLKT is set to a time that causes the right edges of the DATAT window 906 (containing "a") and the receiver setup/hold window 910 (shaded) to coincide. The $t_S$ setup time and $t_H$ hold time surround the CLKR rising edge, together define the setup/hold window 910 (not to be confused with the receiver eye of FIG. 3) in which the value of DATAR must be stable for reliable sampling around a given CLKR rising edge 904. Since the DATAT window, and the resulting DATAR window, are larger than this setup/hold window 910, the transmitter has timing margin. However, in the case shown on trace 905 with the transmit clock rising edge at offset $t_{PHASET(TXA)}$, all the timing margin is on the left side of the transmitter eye for the setup/hold window 910, adding delay after the $t_Q$ timing parameter. There is essentially no margin for the $t_V$ timing parameter in the trace 905, so that the offset defines the left edge of the calibration window.

The calibration process for TXA will compare the received pattern set to the expected pattern set, and determine if they match. If they match (pass) then the TXA value will be decremented (the $T_{PHASET(TXA)}$ offset becomes smaller shifting the transmit window 906 to the left in FIG. 9) or otherwise adjusted, so there is less margin for the $t_V$ timing parameter relative to the receiver setup/hold window 910. If they do not match (fail) then the TXA value will be incremented (the $T_{PHASET(TXA)}$ offset becomes larger shifting the transmit window 906 to the right in FIG. 9), or otherwise adjusted, so there is more margin for the $t_V$ timing parameter.

As mentioned earlier, the results of a sequence including transmission of two or more calibration patterns may be accumulated before the TXA value is adjusted. This would improve the repeatability of the calibration process. For example, the calibration pattern could be repeated "N" times with the number of passes accumulated in a storage element. If all N passes match, then the TXA value is decremented. If any of the N passes does not match, then the TXA value is determined to have reached the edge of the window and is incremented. In another alternative, after the Nth pattern, the TXA value could be incremented if there are fewer than N/2 (or some other threshold number) passes, and decremented if there are N/2 or more passes.

When TXA is updated, the TX value will also be updated. In this example, the TX value will updated by half the amount used to update TXA, since TX is the average of the TXA and TXB values. If TX has a different relationship to TXA and TXB, the TX update value will be different. Note that in some embodiments, the TX value will need slightly greater precision than the TXA and TXB values to prevent round-off error. In alternate embodiments, the TX value can be updated after pass/fail results of TXA and TXB values have been determined. In some cases, these results may cancel and produce no change to the optimal TX value. In other cases these results may be accumulated and the accumulated results used to determine an appropriate adjustment of the TX setting. According to this embodiment, greater precision of the TX setting relative to the TXA and TXB settings may not be required.

When the TXB value is selected ($t_{PHASER(TXB)}$ in the bottom trace 907 showing a CLKT timing waveform) for calibration, the rising edge of CLKT is set to a time that causes the left edge of the transmitter setup/hold window 908 (containing "a") and the receiver setup/hold window 910 (shaded) to coincide. In this case with the transmit clock rising edge at $t_{PHASER(TXB)}$, all the timing margin is on the right side of the transmit window 908, providing more room than required by the $t_V$ timing parameter. This means that there will be essentially no margin for the $t_Q$ timing parameter on the left side of the window 908, defining the right edge of the calibration window.

The calibration process will compare the received pattern set to the expected pattern set, and determine if they match. If they match (pass) then the TXB value will be incremented (the offset becomes larger) or otherwise adjusted, so there is less margin for the $t_Q$ timing parameter. If they do not match (fail) then the TXB value will be decremented (the offset becomes smaller) or otherwise adjusted, so there is more margin for the $t_Q$ timing parameter.

As mentioned earlier, the results of transmission of two or more calibration patterns may be accumulated before the TXB value is adjusted. For example, transmission of the patterns could be repeated "N" times with the number of passes accumulated in a storage element. After the Nth sequence the TXB value could be decremented if there are fewer than N/2 passes and incremented if there are N/2 or more passes. This would improve the repeatability of the calibration process.

When TXB is updated, the TX value will also be updated. In this example, the TX value will updated by half the amount used to update TXB, since TX is the average of the TXA and TXB values. If TX has a different relationship to TXA and TXB, the TX update value will be different. Note that the TX value will need slightly greater precision than the TXA and TXB values if it is desired to prevent round-off error.

Figure 10:
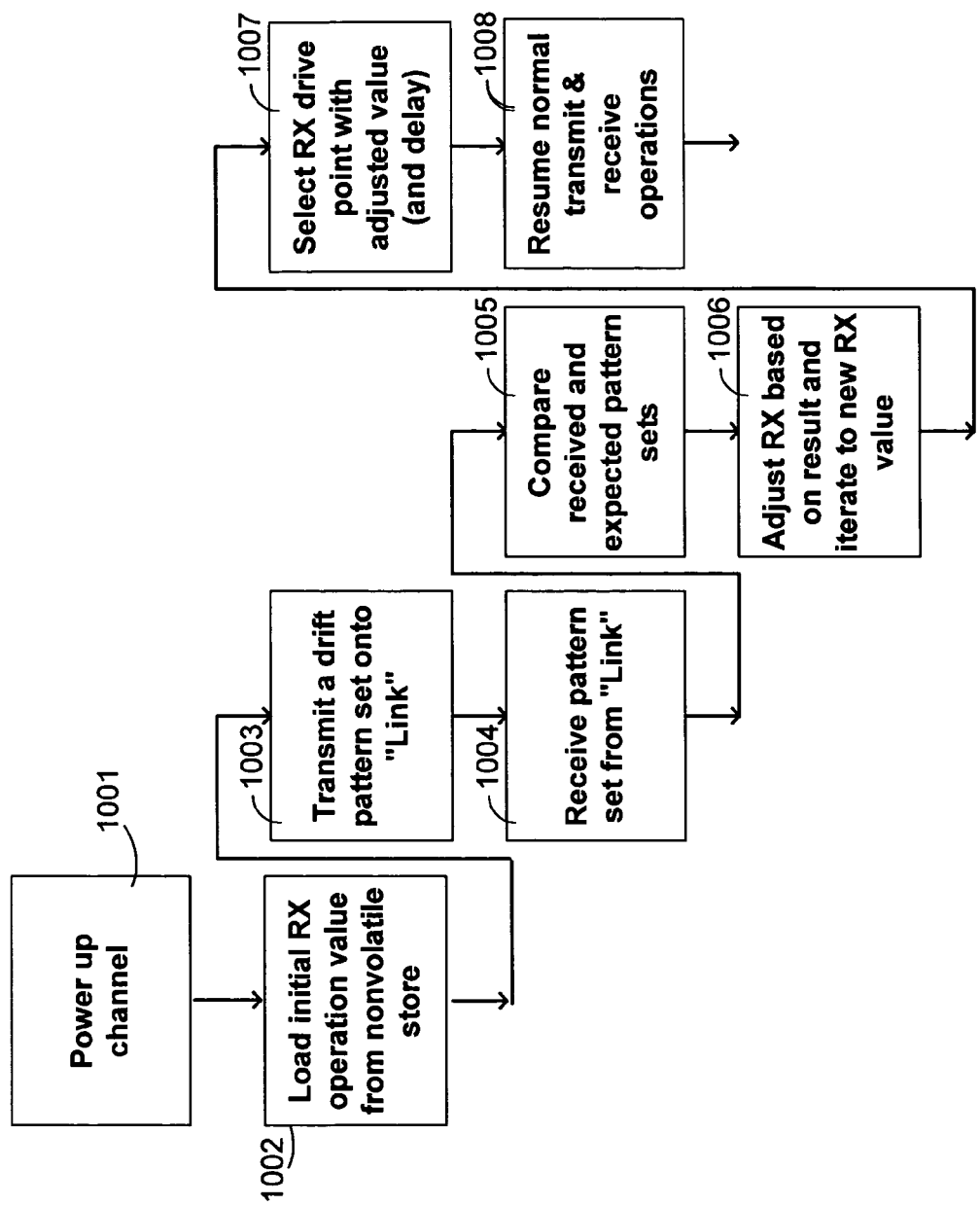
FIG. 10 is a flow chart illustrating representative calibration steps for a receiver on a unidirectional link for a receiver sample point.

FIG. 10 shows the example from FIG. 7, and also includes the steps needed to perform a timing calibration update.

(Step 1001) Power up the communication channel.

(Step 1002) Load the calibrated RX sample point of the receive component from the nonvolatile store. Note that the transmitter is on another device, which may be protected from the power down event, or alternatively the drive point of the transmitter may be fixed relative to the reference clock of the system. In other embodiments, the drive point of the transmitter may also be retrieved from the nonvolatile store in response to a power up event.

(Step 1003) The calibration routine used to detect drift from the calibrated RX sample point is executed, including obtaining a drift calibration pattern set from the source of calibration patterns, and transmitting from the corresponding transmitter on the channel, the pattern set onto the "link" using the TX drive point.

(Step 1004) The pattern set is received in the receive component.

(Step 1005) The received pattern set is compared to the expected pattern set. The two pattern sets will either match or not match. As a result of this comparison (and possibly other previous comparisons) information about the calibration process is determined.

(Step 1006) Adjust RX in the receive component as a result of the calibration determination, and iterate to determine a new RX value. The new value for RX is determined in this iterative step. The pattern set may be transmitted many times while scanning the RX parameter, and results of the comparison stored in order to iteratively establish a necessary adjustment. For example, adjustment may only be made after a calibration sequence including successful transmission of two or more of calibration patterns has been executed, in order to ensure some level of repeatability.

(Step 1007) Change the sample point of the receiver to the new RX operation value (used for normal operations). It may be necessary to impose a settling delay at this step to allow the new drive point to become stable.

(Step 1008) Resume normal transmit and receive operations.

Figure 11:
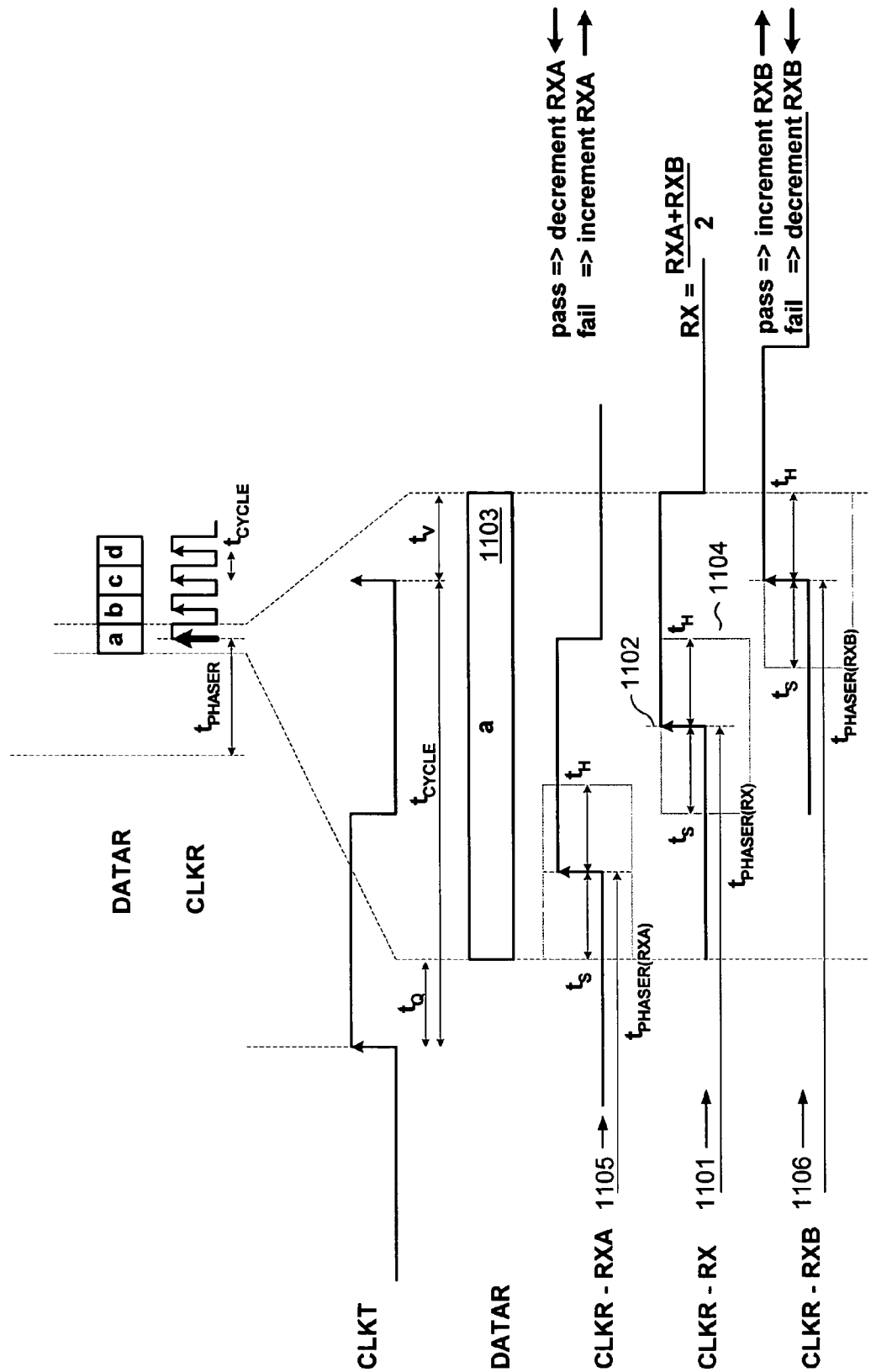
FIG. 11 illustrates timing for iteration steps for one approach to calibrating a receiver sample point.

FIG. 11 shows the timing waveforms used by the receiver calibration steps of FIG. 10 for a system configured for example as shown in FIG. 7. These timing waveforms are similar to those from FIG. 3, except that the sample point is adjusted within the bit window in order to track the edges of the window.

The receive component maintains three values in storage: RXA, RX, and RXB. The RX value is the operation value used for normal operation. RXA and RXB are the "edge" values, which track the left and right extremes of the bit window. Typically, the RX value is derived from the average of the RXA and RXB values, but other relationships are possible. The RXA and RXB values are maintained by the calibration operations, which periodically or otherwise from time to time interrupt normal operations.

In the timing diagrams, the position of the rising edge of CLKR has an offset of $t_{PHASER}$ relative to a fixed reference (not shown, typically a reference clock that is distributed to all components). This offset is determined by the RXA, RX, and RXB values that are stored.

When the RX value is selected ($t_{PHASER(RX)}$ in the middle trace 1101 showing a CLKR timing waveform) for use in receiving data, the rising edge 1102 of CLKR is approximately centered in the receiver eye of the DATAR signal containing the value "a". The DATAR signal is the DATAT signal transmitted at the transmitter after propagation across the link, and can be conceptually considered to be the same width as DATAT as shown in FIG. 11. The receiver eye is shown in FIG. 3. The $t_S$ setup time is the minimum time before the clock CLKR rising edge which must be within the DATAR window 1103, and the $t_H$ hold time is the minimum time after the clock CLKR rising edge that must be within the DATAR window 1103, together defining the setup/hold window 1104 (not to be confused with the receiver eye of FIG. 3) in which the value of DATAR must be stable for reliable sampling around a given CLKR rising edge. Since the valid window 1104 of the DATAR signal is larger than this setup/hold window 1104, the receiver has timing margin in both directions.

When the RXA value is selected ($t_{PHASER(RXA)}$ in the top trace 1105 showing a CLKR timing waveform), the rising edge of CLKR is approximately a time $t_S$ later than the left edge (the earliest time) of the DATAR window 1103 containing the value "a". In this case, the CLKR rising edge is on the left edge of the receiver eye, and all the timing margin is on the right side of the setup/hold window 1104, providing more room than is required by the $t_H$ timing parameter. This means that there will be essentially no margin for the $t_S$ timing parameter, defining the left edge of the calibration window.

The calibration process will compare the received pattern set to the expected pattern set, and determine if they match. If they match (pass) then the RXA value will be decremented (the offset becomes smaller) or otherwise adjusted, so there is less margin for the $t_S$ timing parameter. If they do not match (fail) then the RXA value will be incremented (the offset becomes larger) or otherwise adjusted, so there is more margin for the $t_S$ timing parameter.

As mentioned earlier, the results of transmission and reception of two or more calibration patterns may be accumulated before the RXA value is adjusted. For example, the patterns could be repeated "N" times with the number of passes accumulated in a storage element. After the Nth sequence the RXA value could be incremented if there are fewer than N/2 passes and decremented if there are N/2 or more passes. This would improve the repeatability of the calibration process.

When RXA is updated, the RX value will also be updated. In this example, the RX value will be updated by half the amount used to update RXA, since RX is the average of the RXA and RXB values. If RX has a different relationship to RXA and RXB, the RX update value will be different. Note that in some embodiments, the RX value will need slightly greater precision than the RXA and RXB values to prevent round-off error. In alternate embodiments, the RX value can be updated after pass/fail results of RXA and RXB values have been determined. In some cases, these results may cancel and produce no change to the optimal RX value. In other cases these results may be accumulated and the accumulated results used to determine an appropriate adjustment of the RX setting retrieved from the nonvolatile store.

When the RXB value is selected ($t_{PHASER(RXB)}$ in the bottom trace 1106 showing a CLKR timing waveform), the rising edge of CLKR is approximately a time $t_H$ earlier than the right edge (the latest time) of the DATAR window 1103 containing the value "a". In this case, the CLKR rising edge is on the right edge of the receiver eye, and all the timing margin is on the left side of the window 1104, providing more room than required by the $t_S$ timing parameter. This means that there will be essentially no margin for the $t_H$ timing parameter, defining the right edge of the calibration window.

The calibration process will compare the received pattern set to the expected pattern set, and determine if they match. If they match (pass) then the RXB value will be incremented (the offset becomes larger) or otherwise adjusted, so there is less margin for the $t_H$ timing parameter. If they do not match (fail) then the RXB value will be decremented (the offset becomes smaller) or otherwise adjusted, so there is more margin for the $t_H$ timing parameter.

As mentioned earlier, the results of transmission and reception of two or more calibration patterns may be accumulated before the RXB value is adjusted. For example, the sequence could be repeated "N" times with the number of passes accumulated in a storage element. After the Nth sequence the RXB value could be decremented if there are fewer than N/2 passes and incremented if there are N/2 or more passes. This would improve the repeatability of the calibration process.

When RXB is updated, the RX value will also be updated. In this example, the RX value will updated by half the amount used to update RXB, since RX is the average of the RXA and RXB values. If RX has a different relationship to RXA and RXB, the RX update value will be different. Note that the RX value will need slightly greater precision than the RXA and RXB values if it is desired to prevent round-off error.

Figure 12:
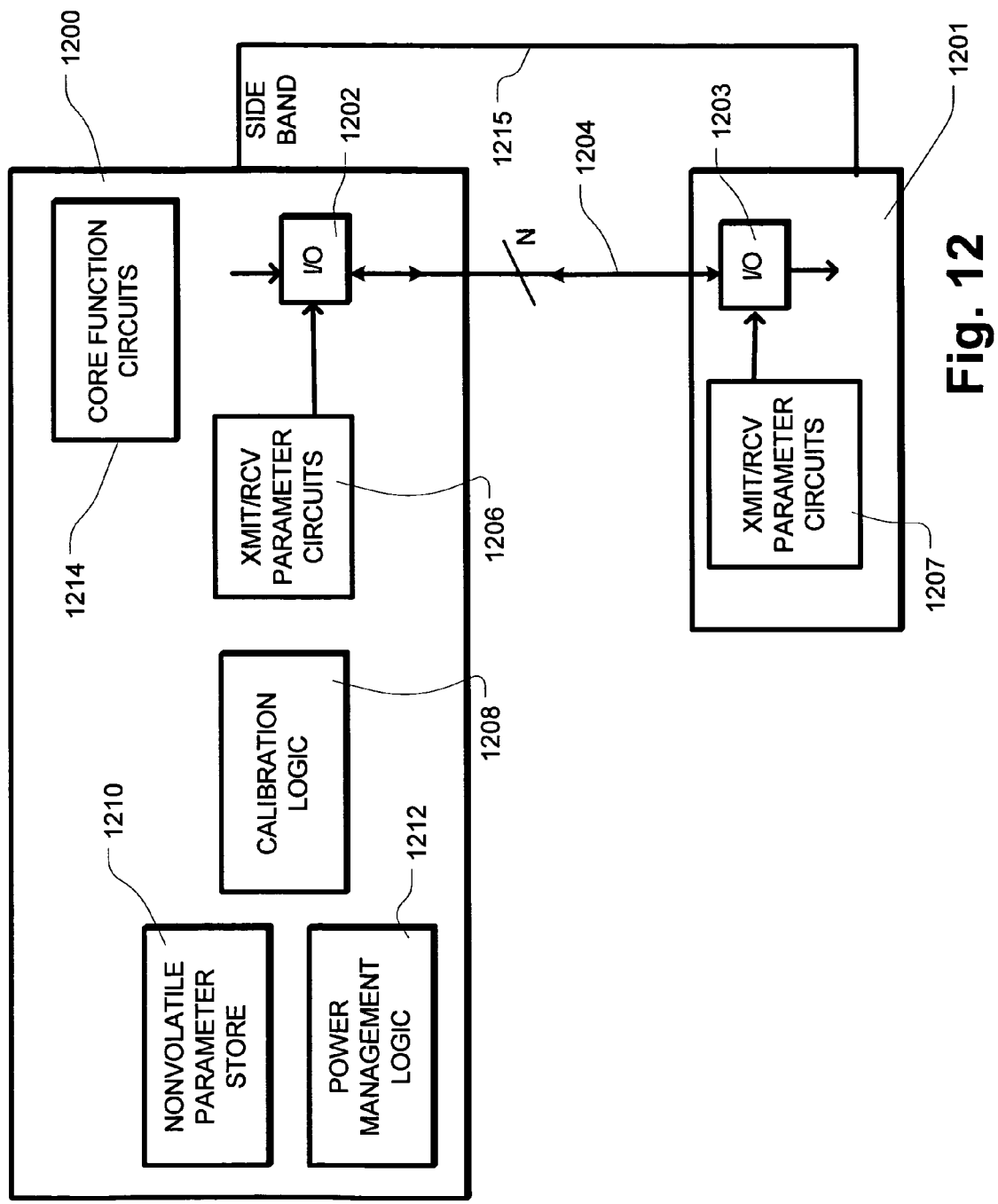
FIG. 12 is a simplified block diagram of an embodiment of the present invention including a single integrated circuit having an input/output interface, a nonvolatile parameter store, power management logic, and calibration logic, coupled to a communication link.

FIGS. 12-16 illustrate a variety of configurations of communication channels including nonvolatile parameter stores according to the present invention. In FIG. 12, a first component 1200 communicates with a second component 1201 by a communication channel comprising the transmitter in an I/O unit 1202 and a receiver in an I/O unit 1203, interconnected by a communication link 1204. Transmit and receive parameter circuits 1206 in the first component 1200 and transmit and receive parameter circuits 1207 in the second component 1201 operate to set the variable parameters of the communication channel as discussed above. The first component 1200 includes calibration logic 1208 coupled with the transmit and receive parameter circuit 1206. Also, the first component 1200 in this example includes an integrated nonvolatile parameter store 1210. In addition, in this embodiment, the first component includes power management logic 1212 coupled with the calibration logic 1208. Core function circuits 1214 are included in the component 1200. The second component 1201 includes core function circuits as well, and may be configured in a wide variety of ways not described, including the same way as the first component 1200. In this example, a side band channel 1215, such as a serial link or lower speed bus, is coupled between the first component 1200 and the second component 1201, by which calibrated parameter values from the nonvolatile parameter store 1210 are delivered to the second component 1201.

Figure 13:
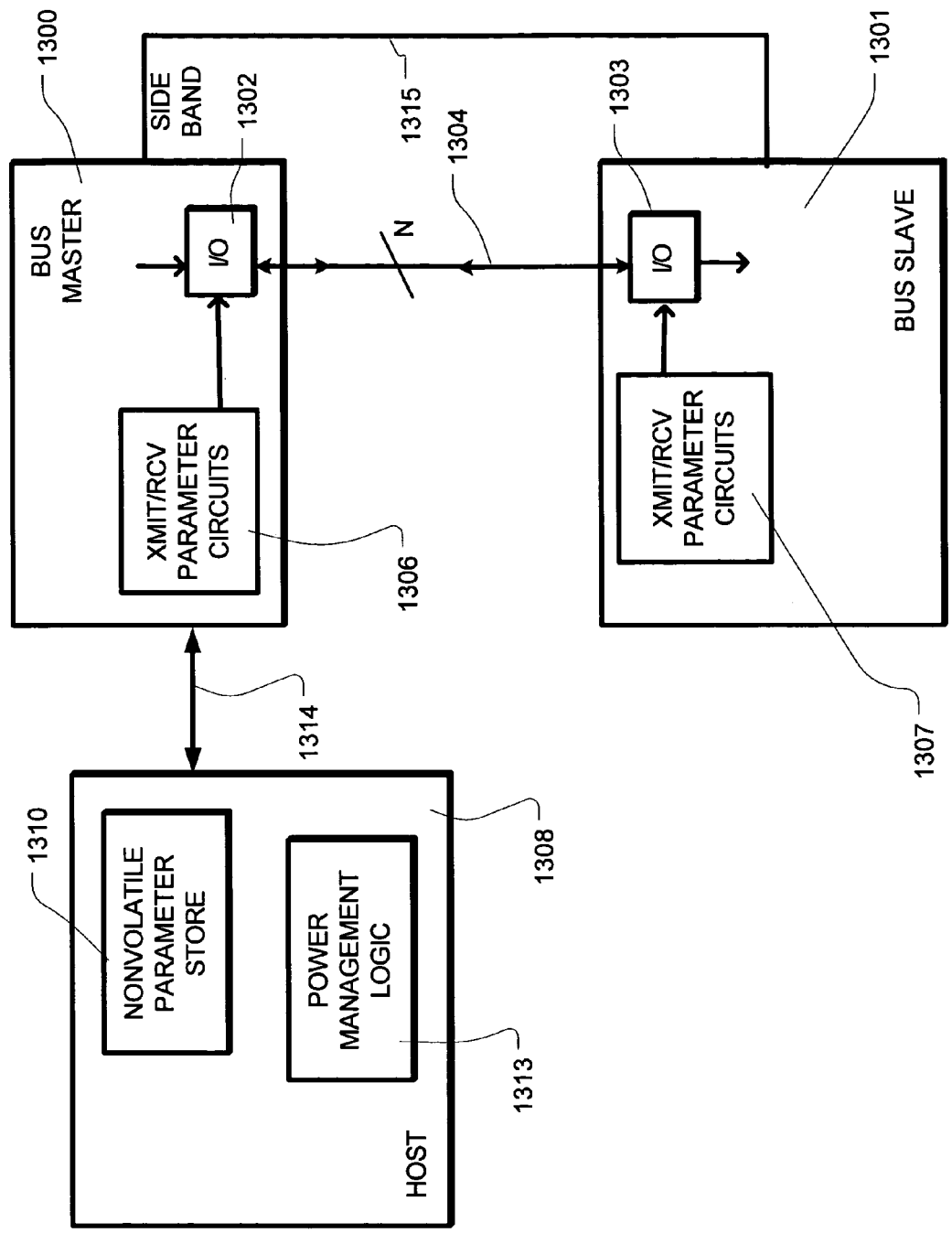
FIG. 13 is a simplified block diagram of another embodiment of the present invention, including a host device having an integrated nonvolatile parameter store and power management logic.

FIG. 13 illustrates another configuration, including a first component 1300 identified as a bus master, and a second component 1301 identified as a bus slave. A bus including a plurality of communication channels including transmitters in the I/O unit 1302 and receivers in the I/O unit 1303 interconnected by communication links 1304 provides a communication path between the bus master 1300 and a bus slave 1301. Transmit and receive parameter circuits 1306 and 1307 are included in the bus master 1300 and bus slave 1301 respectively. In the illustrated embodiment, a host device 1308, such as a central processing unit, includes power management logic 1313 and a nonvolatile parameter store 1310. The host 1308 communicates with bus master 1300 by reliable communication channel 1314, such as a serial link or lower speed bus, allowing the transmit and receive parameter circuits 1306 to download the calibrated parameter values, or alternatively allowing the host to push the calibrated parameter values to the bus master 1300, from the nonvolatile parameter store 1310 when needed. In this example, a side band channel 1315, such as a serial link or lower speed bus, is coupled between the bus master 1300 and the bus slave 1301, by which calibrated parameter values from the nonvolatile parameter store 1310 are delivered to the bus slave 1301.

Figure 14:
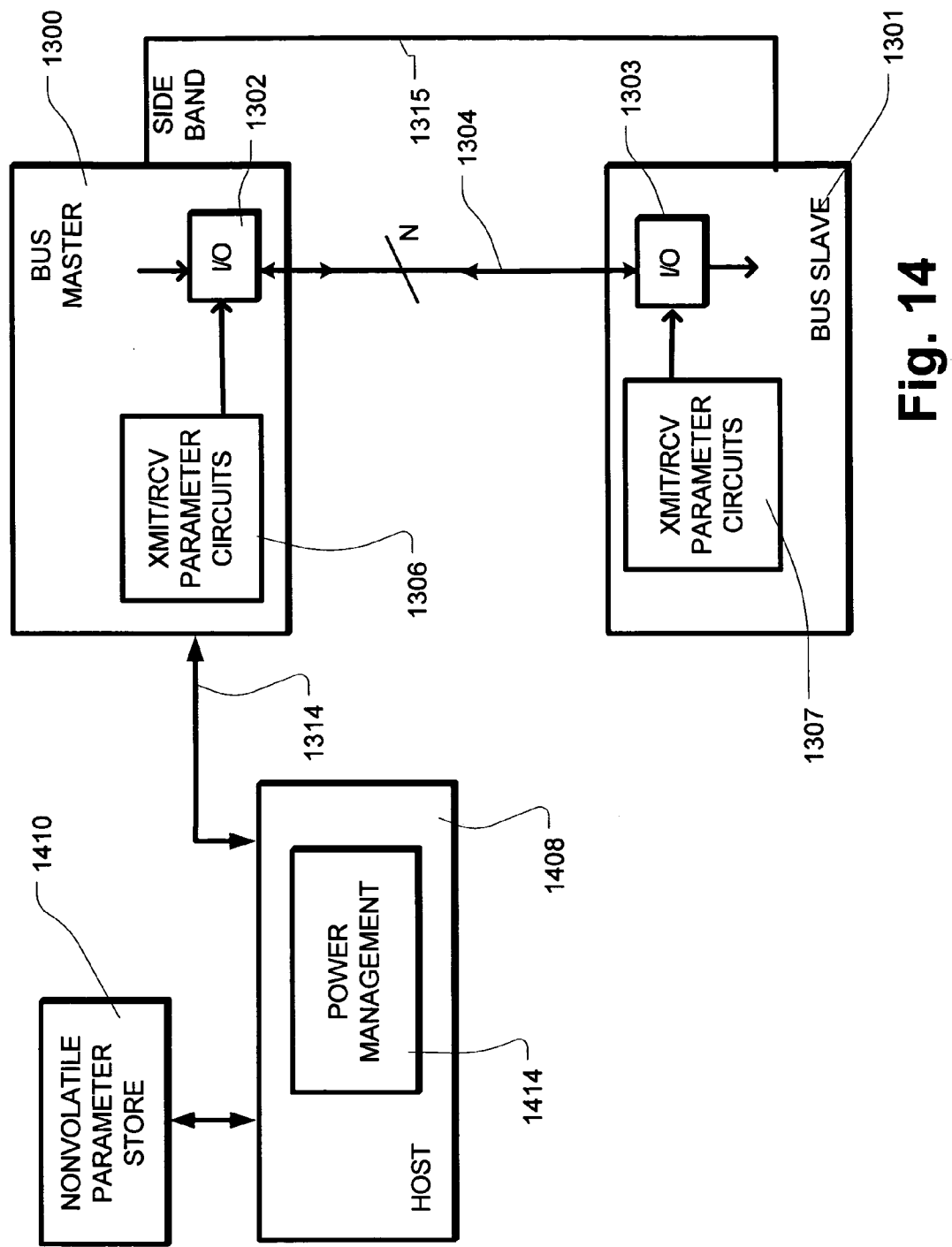
FIG. 14 is a simplified block diagram of another embodiment of the present invention, including a host device with an external nonvolatile parameter store.

FIG. 14 illustrates a modification of the configuration of FIG. 13. Reference numerals for the elements in the configuration of FIG. 14 which are also found in the configuration of FIG. 13 are the same, and such elements are not described again. In the configuration of FIG. 14, the host 1408 includes power management resources 1414. However, the nonvolatile parameter store 1410 is external to the host device 1408, such as a standalone ROM, EEPROM, or other nonvolatile memory device. In this environment, the host includes resources to retrieve the calibrated parameters from the nonvolatile parameter store 1410, and communicate them across the channel 1314 to the bus master 1300.

Figure 15:
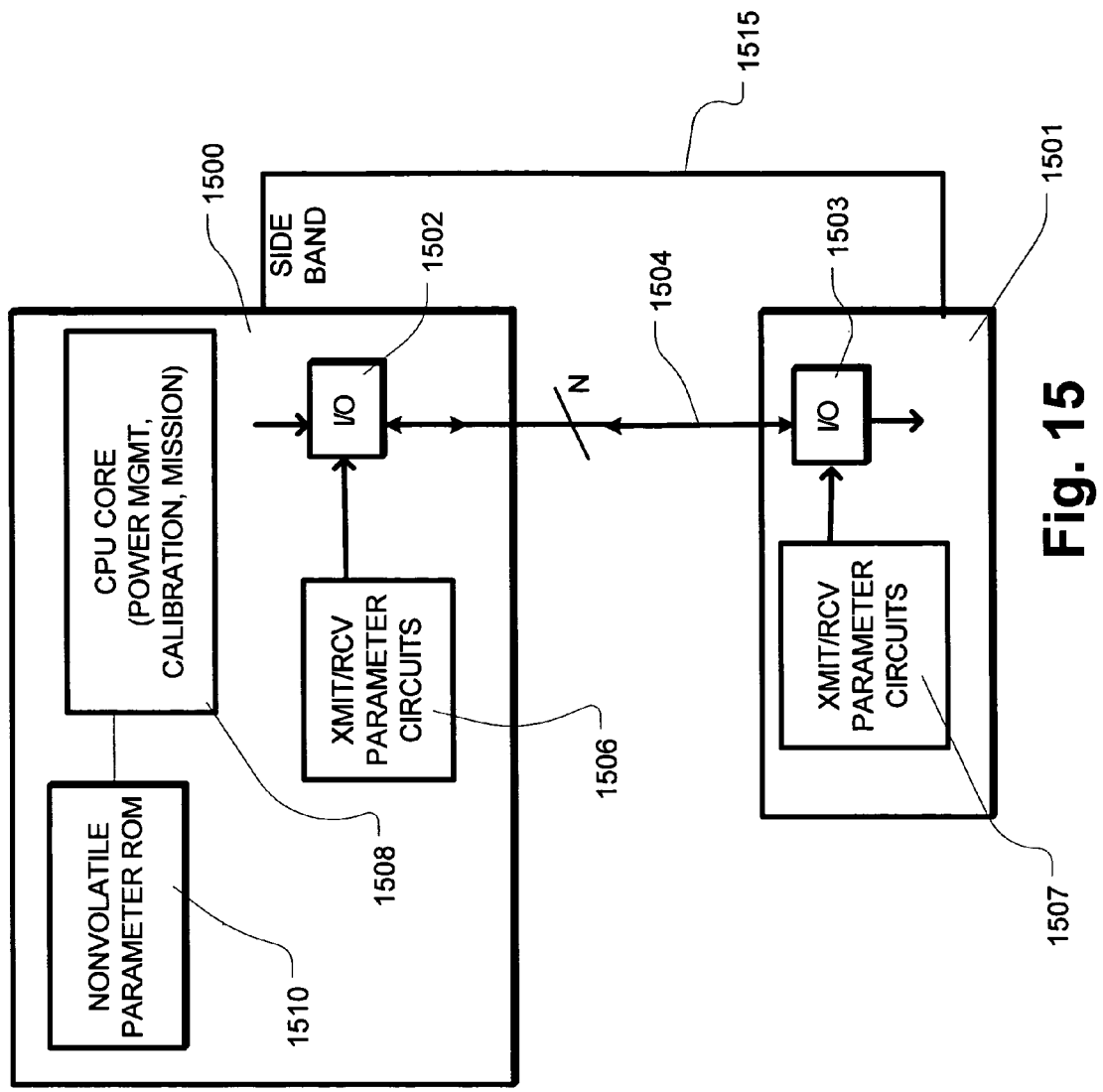
FIG. 15 is a simplified block diagram of another embodiment of the present invention, including a single integrated device having nonvolatile parameter store and a CPU core executing power management, calibration and mission functions.

FIG. 15 illustrates a "system-on-a-chip" configuration, including a first component 1500 comprising a CPU core 1508, and a second component 1501. A bus including a plurality of communication channels including transmitters in the I/O unit 1502 and receivers in the I/O unit 1503 interconnected by communication links 1504 provides a communication path between the first component 1500 and the second component 1501. Transmit and receive parameter circuits 1506 and 1507 are included in the first component 1500 and second component 1501, respectively. In the illustrated embodiment, the CPU core 1508 executes programs for power management, calibration of communication links, and mission functions for the system. A nonvolatile parameter store 1510 is implemented using a read-only memory or other nonvolatile memory on component 1500. In some embodiments, the component 1500 is a single integrated circuit in a system-on-a-chip configuration. In the illustrated example, a side band channel 1515, such as a serial link or lower speed bus, is coupled between the first component 1500 and second component 1501, by which calibrated parameter values from the nonvolatile parameter store 1510 are delivered to the second component 1501.

Figure 16:
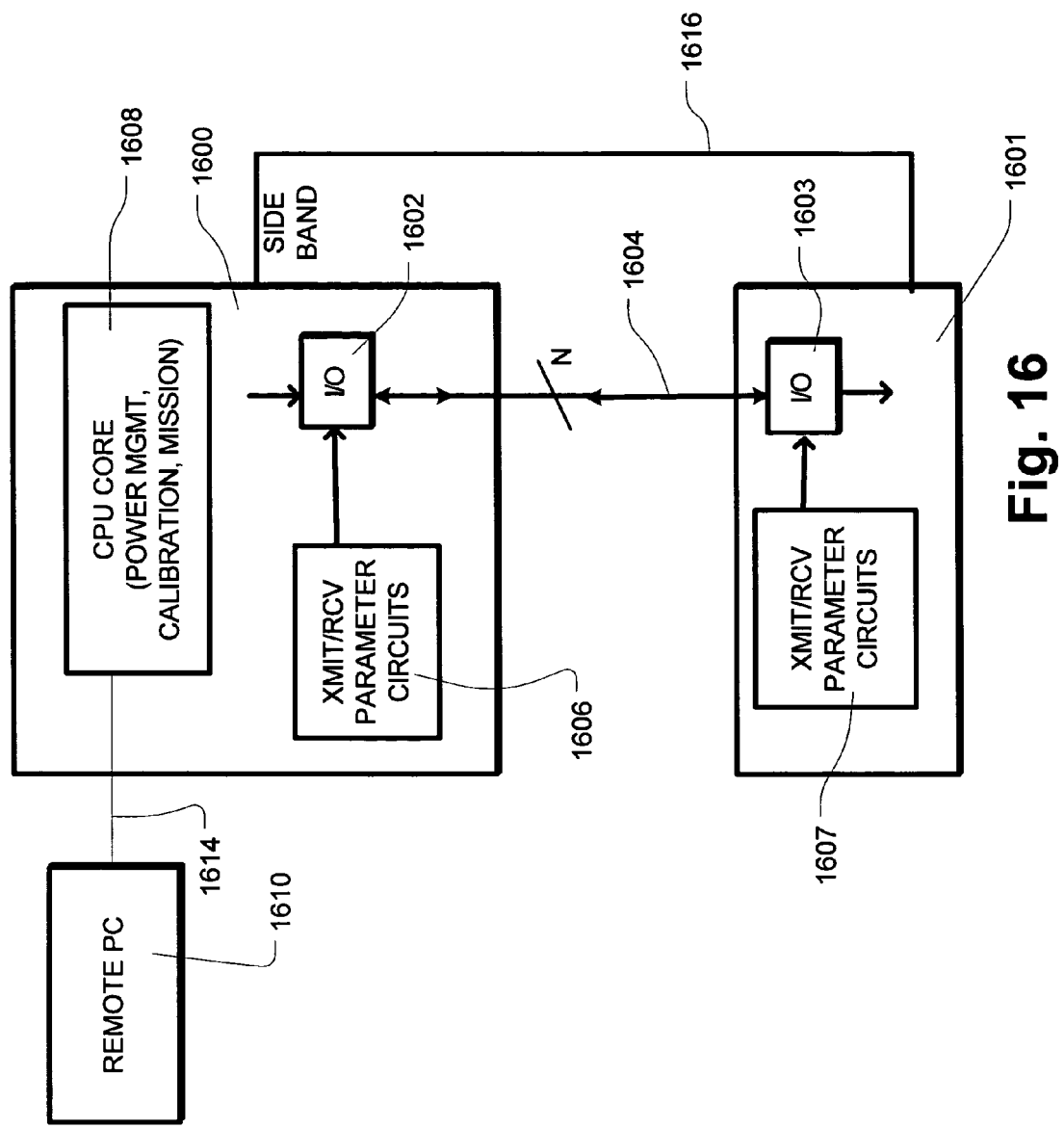
FIG. 16 is a simplified block diagram of yet another embodiment of the present invention, including nonvolatile parameter storage in a remote PC.

FIG. 16 illustrates yet another embodiment of the present invention. The embodiment of FIG. 16 includes a first component 1600 comprising a CPU core 1608, and a second component 1601. A bus including a plurality of communication channels including transmitters in the I/O unit 1602 and receivers in the I/O unit 1603 interconnected by communication links 1604 provides a communication path between the first component 1600 and the second component 1601. Transmit and receive parameter circuits 1606 and 1607 are included in the first component 1600 and second component 1601, respectively. In the illustrated embodiment, the CPU core 1608 executes programs for power management, calibration of communication links, and mission functions for the system. A remote computer, such as a personal computer 1610 is coupled by a communication link 1614 to the first component 1600, and establishes communication with the calibration function in the CPU core 1608. The communication link 1614 may comprise local area or wide area network connections, universal serial bus USB cables, so-called "FireWire" cables, and the like. In this way, the CPU core 1608 is able to download calibrated parameter values from nonvolatile memory in the remote PC 1610, which may store the values on a mass storage device, such as a magnetic disk, optical disk, or may store the values on nonvolatile memory chips. In the illustrated example, a side band channel 1616, such as a serial link or lower speed bus, is coupled between the first component 1600 and second component 1601, by which calibrated parameter values from the storage in remote PC 1610 are delivered to the second component 1601.

Figure 17:
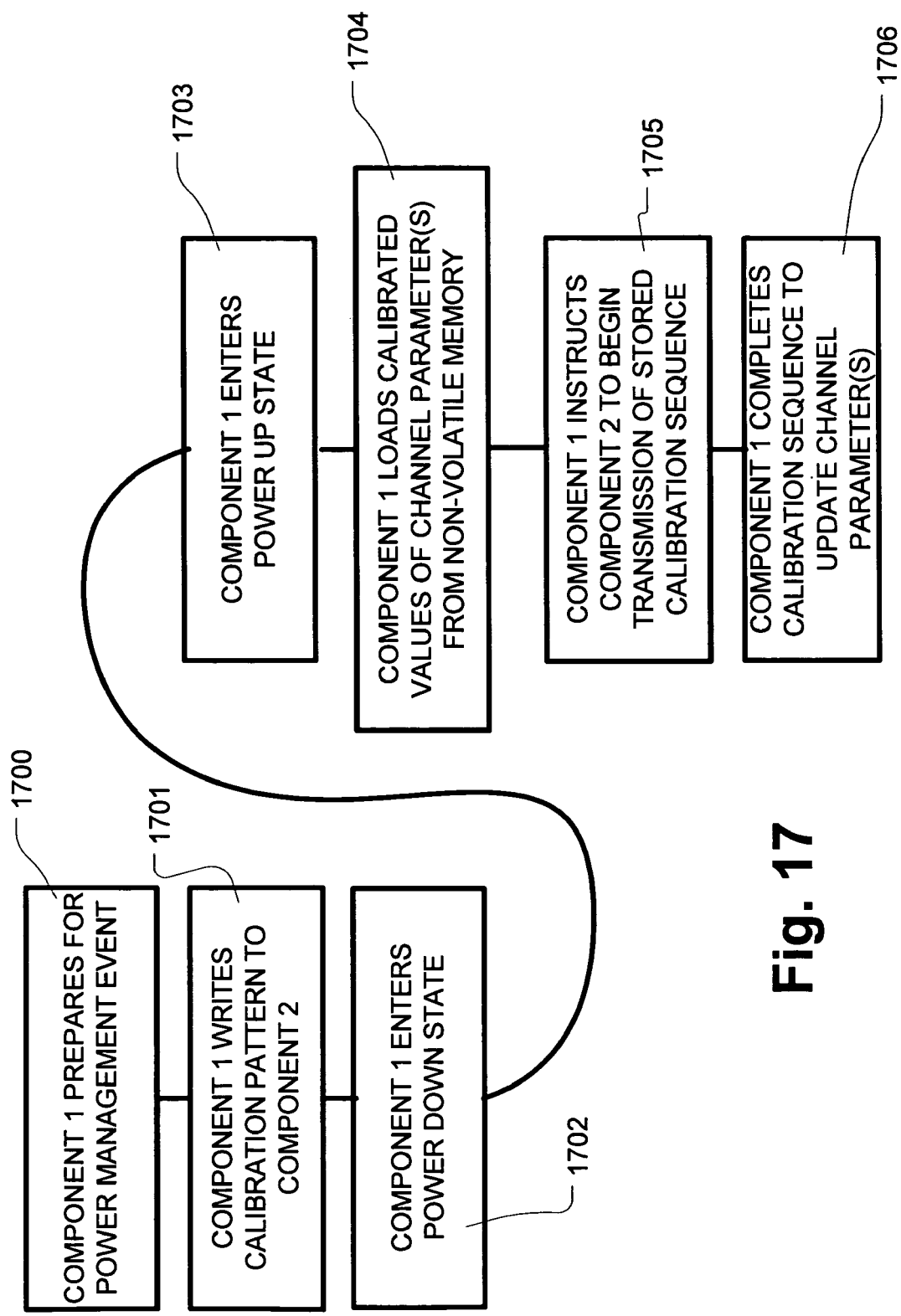
FIG. 17 is a flow chart for a calibration process according to the present invention during a power down/power up event, such as during power management, useful with an embodiment like that shown in FIG. 7.

FIG. 17 illustrates a procedure useful in configurations like that shown in FIG. 7, where a first component which is subject of power management procedures communicates with a second component which is protected from power down during power management events. For example, the second component may comprise a DRAM where power is maintained to support refresh operations during power management operations that conserve power. In such embodiments, the second component may maintain its calibrated parameter values during power down events on the first component.

According to the procedure illustrated in FIG. 17, component 1 prepares for a power management event in a first step (step 1700). As part of the preparation; component 1 uses the high speed bus subject of the calibration operations to write calibration patterns into the memory on component 2, which can be used for calibration after recovery of power (step 1701). Next, component 1 enters a power down state (step 1702). Later, component 1 enters a power up state (step 1703). In preparation for starting up the communication channel, component 1 loads the calibrated values of channel parameters from nonvolatile memory (step 1704). Component 1 then instructs component 2 to begin transmission of the stored calibration patterns from component 2 to component 1 (step 1705). Finally, component 1 completes calibration sequences to update the channel parameters (step 1706). Using the procedure illustrated in FIG. 17, calibration procedures designed to track drift from the calibrated parameter value retrieved from the nonvolatile memory can be executed more quickly after power up for embodiments where component 2 is a simple DRAM or the like, and does not include resources for generation of calibration patterns, by taking advantage of communication bandwidth during the power down sequence to preload component 2 with calibration patterns. The procedure illustrated in FIG. 17 is particularly useful according to the present invention, where calibrated parameter values are stored in nonvolatile memory for use during initial operation of the communication channel after power up. However, is also useful without the support of nonvolatile calibrated parameter stores. In embodiments without nonvolatile calibrated parameter stores, the calibration procedure utilized after power up in a procedure as illustrated in FIG. 17 may be more exhaustive than that required for embodiments that are supported by the nonvolatile calibrated parameter store. Accordingly, prior art techniques used prior to calibration of the communication channel to load the component 2 with a calibration pattern, such as using a slow serial port to transfer the calibration pattern to component 2 prior to calibration, can be replaced by use of the high-speed communication channel prior to power down, significantly shortening the time required for recalibration after restarting the communication channel.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operation in a system including a communication channel, the communication channel including a first component having a transmitter, a second component having a receiver and a communication link coupling the first and second components, comprising:
    after a power up event, executing a calibration process to determine a calibrated parameter value for the communication channel, and storing the calibrated parameter value in nonvolatile memory;
    upon restarting the communication channel in the field, accessing the calibrated parameter value in nonvolatile memory, and setting a value for an operating parameter of the communication channel using the calibrated parameter value; and
    communicating data on the communication channel using the operating parameter; and
    after said restarting, adjusting the value for the operating parameter to account for changes in environmental conditions which have an effect on the communication channel using another calibration process that includes transmitting a calibration pattern from the first component and receiving the calibration pattern in the second component after setting the operating parameter using the calibrated parameter value; wherein the communication channel has a plurality of operating parameters which drift during operation in response to changes in environmental conditions, and including storing calibrated parameter values for each of the plurality of operating parameters in the nonvolatile memory.

2. The method of claim 1, including upon a second power up event later than said restarting and later than said adjusting, accessing the calibrated parameter value in nonvolatile memory, and setting the value for at least one of the operating parameters of the communication channel using the calibrated parameter value; and communicating data on the communication channel using the at least one of the operating parameters.

3. A method of operation in a system including a communication channel, the communication channel including a first component having a transmitter, a second component having a receiver and a communication link coupling the first and second components, comprising:
after a power up event, executing a calibration process to determine a calibrated parameter value for the communication channel, and storing the calibrated parameter value in nonvolatile memory;
upon restarting the communication channel in the field, accessing the calibrated parameter value in nonvolatile memory, and setting a value for an operating parameter of the communication channel using the calibrated parameter value; and
communicating data on the communication channel using the value of the operating parameter, wherein the operating parameter comprises at least one of a drive timing point and a sample timing point for the transmitter and a receiver, respectively, on the first component; wherein the communication channel is one of a plurality of communication channels in a bus, and including storing calibrated parameter values for each of the communication channels in the bus in the nonvolatile memory.

4. A method of operation in a system including a communication channel, the communication channel including a first component having a transmitter, a second component having a receiver and a communication link coupling the first and second components, comprising:
after a power up event, executing a calibration process to determine a calibrated parameter value for the communication channel, and storing the calibrated parameter value in nonvolatile memory;
upon restarting the communication channel in the field, accessing the calibrated parameter value in nonvolatile memory, and setting a value for an operating parameter of the communication channel using the calibrated parameter value; and
communicating data on the communication channel using the value of the operating parameter, wherein the operating parameter comprises at least one of a drive timing point and a sample timing point for a transmitter and the receiver, respectively, on the second component; wherein the communication channel is one of a plurality of communication channels in a bus, and including storing calibrated parameter values for each of the communication channels in the bus in the nonvolatile memory.

5. The method of claim 1, wherein the first component comprises an integrated circuit, and the nonvolatile memory is located on the integrated circuit.

6. The method of claim 1, wherein the first component comprises an integrated circuit, and the nonvolatile memory is located on another integrated circuit.

7. The method of claim 1, wherein an integrated circuit including a host processor is coupled to the first component, and the nonvolatile memory is located on the integrated circuit including the host processor.

8. The method of claim 1, wherein an integrated circuit including a host processor is coupled to the first component, and the nonvolatile memory is located on another integrated circuit coupled to the integrated circuit including the host processor.

9. The method of claim 1, including executing the calibration process upon the power up event after assembly of the communication channel during at least one of manufacturing or testing.

10. A method of operation in a system including a communication channel, the communication channel including a first component having a transmitter, a second component having a receiver and a communication link coupling the first and second components, comprising:
after a power up event, executing a calibration process to determine a calibrated parameter value for the communication channel, and storing the calibrated parameter value in nonvolatile memory;
upon restarting the communication channel in the field, accessing the calibrated parameter value in nonvolatile memory, and setting a value for an operating parameter of the communication channel using the calibrated parameter value; and
communicating data on the communication channel using the value of the operating parameter, including adjusting the value of the operating parameter to account for changes in environmental conditions after said restarting, by executing another calibration process which utilizes less resources of the communication channel than said first mentioned calibration process; wherein the communication channel is one of a plurality of communication channels in a bus, and including storing calibrated parameter values for each of the communication channels in the bus in the nonvolatile memory.

11. A method of operation in a system including a communication channel, the communication channel including a first component having a transmitter, a second component having a receiver and a wire communication link coupling the first and second components, comprising:
after a power up event, executing a calibration process to determine a calibrated parameter value for the communication channel, and storing the calibrated parameter value in nonvolatile memory;
upon restarting the communication channel in the field, accessing the calibrated parameter value in nonvolatile memory, and setting a value for an operating parameter of the communication channel using the calibrated parameter value; and
communicating data on the communication channel using the value of the operating parameter, wherein the first component loses power in a power down event, and the second component includes memory that is protected from power loss, and including after a second power up event subsequent to the power down event, adjusting the value of the operating parameter to account for changes in environmental conditions, by executing a calibration process that includes storing a calibration pattern in the second component before the power down event that precedes the second power up event, and after setting the value of the operating parameter using the calibrated parameter value, transmitting the stored calibration pattern from the second component and receiving the calibration pattern in the first component.

12. The method of claim 1, wherein the communication channel is one of a plurality of communication channels in a bus, and including storing calibrated parameter values for each of the communication channels in the bus in the nonvolatile memory.

13. The method of claim 3, wherein the communication channel has a plurality of operating parameters which drift during operation in response to changes in environmental conditions, and including storing calibrated parameter values for each of the plurality of operating parameters in the nonvolatile memory.

14. A method of operation in a system including a communication channel, the communication channel including a first component having a transmitter, a second component having a receiver and a communication link coupling the first and second components, comprising:
   storing a calibrated parameter value in nonvolatile memory;
   starting operation of the communication channel, including obtaining the calibrated parameter value in nonvolatile memory, and setting a value for an operating parameter of the communication channel equal to or based on the calibrated parameter value;
   communicating data on the communication channel using the value of the operating parameter; and
   adjusting the value of the operating parameter to account for changes in environmental conditions which have an effect on the communication channel; and
   generating the calibrated parameter value using a first calibration process, and wherein the adjusting of the value of the operating parameter comprises executing a second calibration process, and the second calibration process utilizes less resources of the communication channel than the first calibration process; wherein the communication channel has a plurality of operating parameters which drift during operation in response to changes in environmental conditions, and including storing calibrated parameter values for each of the plurality of operating parameters in the nonvolatile memory.

15. The method of claim 14, wherein starting operation of the communication is executed in during field operation of the communication channel.

16. The method of claim 14, wherein starting operation of the communication channel includes re-starting after a power down event on the communication channel.

17. A method of operation in a system including a communication channel, the communication channel including a first component having a transmitter, a second component having a receiver and a wire communication link coupling the first and second components, comprising:
   storing a calibrated parameter value in nonvolatile memory;
   starting operation of the communication channel, including obtaining the calibrated parameter value in nonvolatile memory, and setting a value for an operating parameter of the communication channel equal to or based on the calibrated parameter value;
   communicating data on the communication channel using the value of the operating parameter; and
   adjusting the value of the operating parameter to account for changes in environmental conditions which have an effect on the communication channel, wherein the operating parameter comprises at least one of a drive timing point and a sample timing point for the transmitter and a receiver, respectively, on the first component.

18. A method of operation in a system including a communication channel, the communication channel including a first component having a transmitter, a second component having a receiver and a wire communication link coupling the first and second components, comprising:
   storing a calibrated parameter value in nonvolatile memory;
   starting operation of the communication channel, including obtaining the calibrated parameter value in nonvolatile memory, and setting a value for an operating parameter of the communication channel equal to or based on the calibrated parameter value;
   communicating data on the communication channel using the value of the operating parameter; and
   adjusting the value of the operating parameter to account for changes in environmental conditions which have an effect on the communication channel, wherein the operating parameter comprises at least one of a drive timing point and a sample timing point for a transmitter and the receiver, respectively, on the second component.

19. The method of claim 14, wherein the first component comprises an integrated circuit, and the nonvolatile memory is located on the integrated circuit.

20. The method of claim 14, wherein the first component comprises an integrated circuit, and the nonvolatile memory is located on another integrated circuit.

21. The method of claim 14, wherein an integrated circuit including a host processor is coupled to the first component, and the nonvolatile memory is located on the integrated circuit including the host processor.

22. The method of claim 14, wherein an integrated circuit including a host processor is coupled to the first component, and the nonvolatile memory is located on another integrated circuit coupled to the integrated circuit including the host processor.

23. The method of claim 17, including setting the calibrated parameter value based on system configuration.

24. The method of claim 17, including setting the calibrated parameter value based on system configuration during manufacturing.

25. A method of operation in a system including a communication channel, the communication channel including a first component having a transmitter, a second component having a receiver and a communication link coupling the first and second components, comprising:
   storing a calibrated parameter value in nonvolatile memory;
   starting operation of the communication channel, including obtaining the calibrated parameter value in nonvolatile memory, and setting a value for an operating parameter of the communication channel equal to or based on the calibrated parameter value;
   communicating data on the communication channel using the operating parameter; and
   adjusting the value of the operating parameter to account for changes in environmental conditions which have an effect on the communication channel, wherein the adjusting of the value of the operating parameter comprises executing a calibration process that includes transmitting a calibration pattern from the first component and receiving the calibration pattern in the second component after setting the value of the operating parameter using the calibrated parameter value; wherein the communication channel has a plurality of operating parameters which drift during operation in response to changes in environmental conditions, and including storing calibrated parameter values for each of the plurality of operating parameters in the nonvolatile memory.

26. A method of operation in a system including a communication channel, the communication channel including a first component having a transmitter, a second component having a receiver and a communication link coupling the first and second components, comprising:
storing a calibrated parameter value in nonvolatile memory;
starting operation of the communication channel, including obtaining the calibrated parameter value in nonvolatile memory, and setting a value for an operating parameter of the communication channel equal to or based on the calibrated parameter value;
communicating data on the communication channel using the operating parameter; and
adjusting the value of the operating parameter to account for changes in environmental conditions which have an effect on the communication channel, wherein the first component loses power in a power down event, and the second component includes memory which does not lose power in the power down event, and the adjusting of the value of the operating parameter comprises executing a calibration process that includes storing a calibration pattern in the second component before the power down event, and after setting the value of the operating parameter to the calibrated parameter value, transmitting the stored calibration pattern from the second component and receiving the calibration pattern in the first component; wherein the communication channel has a plurality of operating parameters which drift during operation in response to changes in environmental conditions and including storing calibrated parameter values for each of the plurality of operating parameters in the nonvolatile memory.

27. A method of operation in a system including a communication channel, the communication channel including a first component having a transmitter, a second component having a receiver and a communication link coupling the first and second components, comprising:
storing a calibrated parameter value in nonvolatile memory;
starting operation of the communication channel, including obtaining the calibrated parameter value in nonvolatile memory, and setting a value for an operating parameter of the communication channel equal to or based on the calibrated parameter value;
communicating data on the communication channel using the operating parameter; and
adjusting the value of the operating parameter to account for changes in environmental conditions which have an effect on the communication channel, wherein the adjusting of the value of the operating parameter comprises executing a calibration process before communicating data on the communication channel, the calibration process including transmitting a calibration pattern from the first component and receiving the calibration pattern in the second component after setting the operating parameter to the calibrated parameter value; wherein the communication channel is one of a plurality of communication channels in a bus, and including storing calibrated parameter values for each of the communication channels in the bus in the nonvolatile memory.

28. The method of claim 14, wherein the communication channel is one of a plurality of communication channels in a bus, and including storing calibrated parameter values for each of the communication channels in the bus in the nonvolatile memory.

29. The method of claim 17, wherein the communication channel has a plurality of operating parameters which drift during operation in response to changes in environmental conditions, and including storing calibrated parameter values for each of the plurality of operating parameters in the nonvolatile memory.

30. A system interface, the system including a plurality of communication channels, the channels including a transmitter, a receiver and a communication link coupling the transmitter and the receiver, comprising:
nonvolatile memory storing a plurality of calibrated parameter values;
a plurality of interface modules adapted to be connected to communication links in corresponding communication channels in the system, the interface modules including at least one of a transmitter and a receiver, and being responsive to a value of an operating parameter; and
logic executed on starting field operation of the system, which accesses the calibrated parameter values in the nonvolatile memory, and sets the values of the operating parameters of the interface modules in the plurality of interface modules using the calibrated parameter values; wherein the operating parameter comprises at least one of a drive timing point and a sample timing point; wherein the communication channels have a plurality of operating parameters which drift during operation in response to changes in environmental conditions, and including storing calibrated parameter values for each of the plurality of operating parameters for the plurality of communication channels in the nonvolatile memory.

31. The system interface of claim 30, including:
logic which adjusts the values of the operating parameters to account for current environmental conditions which affect the communication channels.

32. The system interface of claim 30, wherein the logic executed on starting field operation of the communication channel is executed on re-starting after a power down event on the system.

33. The system interface of claim 30, wherein the plurality of interface modules are located on an integrated circuit, and the nonvolatile memory is located on said integrated circuit.

34. The system interface of claim 30, wherein the plurality of interface modules are located on an integrated circuit, and the nonvolatile memory is located on another integrated circuit.

35. The system interface of claim 30, including an integrated circuit including a host processor coupled to the plurality of interface modules, and the nonvolatile memory is located on the integrated circuit including the host processor.

36. The system interface of claim 30, including an integrated circuit including a host processor coupled to the plurality of interface modules, and the nonvolatile memory is located on another integrated circuit coupled to the integrated circuit including the host processor.

37. The system interface of claim 30, including resources to set the calibrated parameter values in the nonvolatile memory based on system configuration.

38. The system interface of claim 30, including resources to set the calibrated parameter values in the nonvolatile memory based on system configuration during manufacturing.

39. A system interface, the system including a plurality of communication channels, the channels including a transmitter, a receiver and a wire communication link coupling the transmitter and the receiver, comprising:

nonvolatile memory storing a plurality of calibrated parameter values;

a plurality of interface modules adapted to be connected to communication links in corresponding communication channels in the system, the interface modules including at least one of a transmitter and a receiver, and being responsive to a value of an operating parameter; and logic executed on starting field operation of the system, which accesses the calibrated parameter values in the nonvolatile memory, and sets the values of the operating parameters of the interface modules in the plurality of interface modules using the calibrated parameter values, where the calibrated parameter values are generated using a first calibration process, and including logic which adjusts the values of the operating parameters to account for current environmental conditions which affect the communication channels by executing a second calibration process, wherein the second calibration process utilizes less resources of the communication channel than the first calibration process.

40. A system interface, the system including a plurality of communication channels, the channels including a transmitter, a receiver and a wire communication link coupling the transmitter and the receiver, comprising:

nonvolatile memory storing a plurality of calibrated parameter values;

a plurality of interface modules adapted to be connected to communication links in corresponding communication channels in the system, the interface modules including at least one of a transmitter and a receiver, and being responsive to a value of an operating parameter; and logic executed on starting field operation of the system, which accesses the calibrated parameter values in the nonvolatile memory, and sets the values of the operating parameters of the interface modules in the plurality of interface modules using the calibrated parameter values, including logic which adjusts the values of the operating parameters to account for current environmental conditions which affect the communication channels by executing a calibration process that includes one of transmitting and receiving a calibration pattern after setting the values of the operating parameters using the calibrated parameter values.

41. A system interface, the system including a plurality of communication channels, the channels including a transmitter, a receiver and a wire communication link coupling the transmitter and the receiver, comprising:

nonvolatile memory storing a plurality of calibrated parameter values;

a plurality of interface modules adapted to be connected to communication links in corresponding communication channels in the system, the interface modules including at least one of a transmitter and a receiver, and being responsive to a value of an operating parameter; and logic executed on starting field operation of the system, which accesses the calibrated parameter values in the nonvolatile memory, and sets the values of the operating parameters of the interface modules in the plurality of interface modules using the calibrated parameter values, wherein the plurality of interface modules lose power in the power down event, and a component coupled to the bus includes memory that does not lose power in the power down event, and including logic which adjusts the values of the operating parameters to account for current environmental conditions which affect the communication channels by executing a calibration process that includes storing a calibration pattern in the memory protected from power loss before the power down event, and after setting the values of the operating parameters to the calibrated parameter values, receiving the calibration pattern transmitted from the component that includes the memory.

42. A system interface, the system including a plurality of communication channels, the channels including a transmitter, a receiver and a wire communication link coupling the transmitter and the receiver, comprising:

nonvolatile memory storing a plurality of calibrated parameter values;

a plurality of interface modules adapted to be connected to communication links in corresponding communication channels in the system, the interface modules including at least one of a transmitter and a receiver, and being responsive to a value of an operating parameter; and logic executed on starting field operation of the system, which accesses the calibrated parameter values in the nonvolatile memory, and sets the values of the operating parameters of the interface modules in the plurality of interface modules using the calibrated parameter values, including logic which adjusts the values of the operating parameters to account for current environmental conditions which affect the communication channels by executing a calibration process, the calibration process including one of transmitting and receiving a calibration pattern after setting the values of the operating parameter using the calibrated parameter value.

43. The system interface of claim 42, wherein the communication channels have a plurality of operating parameters which drift during operation in response to changes in environmental conditions, and including storing calibrated parameter values for each of the plurality of operating parameters for the plurality of communication channels in the nonvolatile memory.

44. A method for operating a system in a power down and power up cycle, the system interconnecting a first component and a second component, and including a plurality of communication channels, respective channels in the plurality of channels including a transmitter on the first component, a receiver on the second component, and a wire communication link coupling the transmitter and the receiver, the method comprising:

prior to power down on the first component, transmitting a calibration pattern from the first component to the second component using the plurality of communication channels, and storing the calibration pattern in the second component; and upon power up on the first component, executing a calibration process including transmitting the calibration pattern from the second component and receiving the calibration pattern on the first component to establish values for operating parameters to be used in the plurality of communication channels use during normal operations.

45. The method of claim 44, including:

storing calibrated parameter values in nonvolatile memory;

upon power up on the first component, accessing the calibrated parameter values in nonvolatile memory, and setting values for operating parameters of the plurality of communication channels for use during the calibration process; and adjusting the values for operating parameters in response to the calibration process to account for changes in environmental conditions which have an effect on the communication channel.

* * * * *

UNITED STATES PATENT AND TRADEMARK OFFICE
CERTIFICATE OF CORRECTION

PATENT NO. : 7,978,754 B2  Page 1 of 1
APPLICATION NO. : 10/857483
DATED : July 12, 2011
INVENTOR(S) : Philip Yeung et al.

It is certified that error appears in the above-identified patent and that said Letters Patent is hereby corrected as shown below:

On the title page, item (75) Inventors, after "Philip Yeung, Mountain View, CA" delete (US) and insert -- (HK) --.

Signed and Sealed this
Twenty-fifth Day of October, 2011

David J. Kappos
*Director of the United States Patent and Trademark Office*